US009164342B2

(12) United States Patent
Moriwaki

(10) Patent No.: US 9,164,342 B2
(45) Date of Patent: Oct. 20, 2015

(54) CIRCUIT SUBSTRATE AND DISPLAY DEVICE

(75) Inventor: Hiroyuki Moriwaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 1239 days.

(21) Appl. No.: 13/119,713

(22) PCT Filed: May 12, 2009

(86) PCT No.: PCT/JP2009/058853
§ 371 (c)(1),
(2), (4) Date: Mar. 17, 2011

(87) PCT Pub. No.: WO2010/035543
PCT Pub. Date: Apr. 1, 2010

(65) Prior Publication Data
US 2011/0170274 A1    Jul. 14, 2011

(30) Foreign Application Priority Data

Sep. 26, 2008   (JP) .................................. 2008-248424

(51) Int. Cl.
*H05K 7/00* (2006.01)
*G02F 1/1368* (2006.01)
(Continued)

(52) U.S. Cl.
CPC .......... *G02F 1/1368* (2013.01); *G02F 1/13452* (2013.01); *H01L 24/06* (2013.01); *H01L 24/29* (2013.01); *H01L 24/05* (2013.01); *H01L 24/32* (2013.01); *H01L 24/83* (2013.01); *H01L 27/124* (2013.01); *H01L 2224/04026* (2013.01); *H01L 2224/05548* (2013.01); *H01L 2224/06102* (2013.01); *H01L 2224/2929* (2013.01); *H01L 2224/2939* (2013.01);
(Continued)

(58) Field of Classification Search
USPC ......................... 361/749–750, 803, 760–784; 174/250–258; 349/149–155
See application file for complete search history.

(56) References Cited

U.S. PATENT DOCUMENTS 6,466,294 B1 * 10/2002 Yamagishi et al. ........... 349/155
6,961,111 B1   11/2005 Kuramasu et al.
(Continued)

FOREIGN PATENT DOCUMENTS

JP    H3-58019 A     3/1991
JP    10-282522 A    10/1998
(Continued)

OTHER PUBLICATIONS

International Search Report (ISR) issued in PCT/JP2009/058853 (International application) mailed in Aug. 2009 for Examiner consideration.

*Primary Examiner* — Tuan T Dinh
(74) *Attorney, Agent, or Firm* — Chen Yoshimura LLP

(57) ABSTRACT

Provided is a circuit substrate which can integrate circuit elements without degrading wiring characteristics, and a display device including the circuit substrate. The circuit substrate of the present invention includes a transistor substrate (10) which is a support substrate (1) having a transistor (20) and an external connection terminal (50) mounted thereon, and an external member (60) attached on the transistor substrate (10). The external member (60) is connected physically and electrically to the external connection terminal (50) through a conductive member (3), and the transistor (20) and the external connection terminal (50) are arranged side by side.

29 Claims, 6 Drawing Sheets

(51) Int. Cl.
*G02F 1/1345* (2006.01)
*H01L 23/00* (2006.01)
*H01L 27/12* (2006.01)

(52) U.S. Cl.
CPC ............... *H01L 2224/29444* (2013.01); *H01L 2224/29455* (2013.01); *H01L 2224/32148* (2013.01); *H01L 2224/83* (2013.01); *H01L 2924/01029* (2013.01); *H01L 2924/1305* (2013.01); *H01L 2924/1306* (2013.01); *H01L 2924/14* (2013.01); *H01L 2924/15788* (2013.01); *H01L 2924/19041* (2013.01); *H01L 2924/19043* (2013.01)

(56) References Cited

U.S. PATENT DOCUMENTS

| 7,868,989 B2 * | 1/2011 | Yokota .......................... 349/152 |
| 2003/0155943 A1 | 8/2003 | Morishita |
| 2005/0253141 A1 * | 11/2005 | Ohta et al. ...................... 257/59 |
| 2006/0119778 A1 * | 6/2006 | Oda et al. ...................... 349/149 |
| 2008/0173900 A1 * | 7/2008 | Yoon et al. .................... 257/203 |

FOREIGN PATENT DOCUMENTS

| JP | 2001-154218 A | 6/2001 |
| JP | 2003-167265 A | 6/2003 |

* cited by examiner

CIRCUIT SUBSTRATE AND DISPLAY DEVICE

TECHNICAL FIELD

The present invention relates to a circuit substrate and a display device. More particularly, the present invention relates to a circuit substrate suitable for mobile devices such as a cellular phone and a display device provided with the above circuit substrate.

BACKGROUND ART

In recent years, for mobile electronic devices such as a cellular phone or a PDA using liquid display device, organic EL display device or the like, further size and weight reduction are desired. Accordingly, there is a trend for a smaller region around display area, i.e. narrower frame region, and vigorous development of such is underway.

For thickness and cost reduction, there is an increased trend for display devices provided with a full monolithic type circuit substrate having a peripheral circuit necessary for driving, such as a driver circuit. In a display device provided with a full monolithic type circuit substrate, a circuit for driving the pixels is formed on the circuit substrate. As a result, a part of the area of the circuit substrate that is not a display region (frame region) increases. Therefore, development for a narrower frame is underway.

In a conventional display device, low resistance aluminum is used for wiring inside a panel. When this wiring is extended to the panel exterior to be used as an external connection terminal, an exposed part of the aluminum film can become corroded. To address this problem, a measure was taken in which the aluminum film used for the wiring inside the panel is connected to a separate metal film disposed in a lower layer below the aluminum film inside the panel, and the metal film is used to connect the wiring inside the panel to the panel exterior (see Patent Document 1, for example).

In Patent Document 1, a configuration which prevents corrosion of an external connection terminal is also disclosed. In this configuration, an aluminum film is used as a wiring inside the panel and the aluminum film is extended to the panel exterior to be used as an external connection terminal. An exposed portion of the aluminum film extended to the panel exterior is covered with a chrome (Cr) film and an indium tin oxide (ITO) film.

RELATED ART DOCUMENTS

Patent Documents

Patent Document 1: Japanese Patent Application Laid-Open Publication No. H3-58019

SUMMARY OF THE INVENTION

Problems to be Solved by the Invention

However, as in the configuration disclosed by Patent Document 1, when a wiring inside a panel is connected to a separate metal film formed in a lower layer below the wiring, the metal film is extended, and the extended portion is used as an external connection terminal, it was necessary to provide a region for the external connection terminal and a region for disposing the wiring inside the panel separately, which increases the frame area. In this respect, there was a room for improvement.

The present inventor has conducted investigations for circuit substrates suitable for narrowing of the frame area of a display device, and focused on the position of an external connection terminal. In a conventional display device, wiring inside a panel was connected to a metal film disposed on a lower layer below the wiring, the metal film was extended, and the extended portion of the metal film was used as an external connection terminal. The present inventor found that, in that configuration, a region used as the external connection terminal and a region used as the wiring needed to be provided separately, which increased the frame area. The present inventor has also found that a frame area can be reduced if a circuit substrate has a configuration in which a wiring is disposed in a lower layer below an external connection terminal so that the external connection terminal and the wiring can be overlapped with each other.

On the other hand, however, when the wiring is disposed in a lower layer below the external connection terminal, and the external connection terminal and external member are unified by, for example, pressure bonding under a certain pressure, the wiring disposed in the lower layer below the external connection terminal is heavily stressed, which can cause shorting between wirings or deterioration of the wiring characteristics. In this respect, there was still a room for improvement regarding how to narrow the frame area of a display device.

The present invention was devised in consideration of the current situations described above, and aiming at providing a circuit substrate which allows integration of circuit elements without deteriorating the wiring characteristics and a display device including the circuit substrate.

Means for Solving the Problems

The present inventor conducted investigations on methods of integrating circuit elements without degrading the wiring characteristics, and found that deterioration of the wiring characteristics can occur in a configuration where a narrow circuit wiring is disposed in a lower layer below the external connection terminal and the circuit wiring is narrower than at least a width of a conductive member connecting the external connection terminals to an external member, because of the pressure generated when the external connection terminal is connected to external member. In the case of a fine circuit wiring such as this, the present inventor has found that the characteristics deterioration is unlikely to occur if the wiring is arranged without overlapping the external connection terminal, that is, side by side with the external connection terminal.

Besides the fine circuit wiring such as the one described above, similarly, the present inventor also found that when a transistors is disposed on a lower layer below the external connection terminal, deterioration of the characteristics of the transistor may occur. Also, similarly, the present inventor found that by arranging the transistor so that it does not overlap the external connection terminal, that is, by arranging the transistor side by side with the external connection terminal, deterioration of the characteristics of the transistor is unlikely to occur.

As described above, the present inventors achieved an integration of circuit elements by overlapping the external connection terminals and the external member. Furthermore, the present inventor found that by disposing the transistor and the wiring having a narrow width side by side with the external connection terminal, deterioration of the characteristics of the wiring and transistor can be suppressed. As a result, the above-mentioned problems have been admirably solved, leading to completion of the present invention.

That is, the present invention is a circuit substrate including a transistor substrate composed of a support substrate having a transistor and an external connection terminal mounted thereon and an external member attached to the transistor substrate, wherein the external member is connected physically and electrically to the external connection terminal through a conductive member and the transistor is disposed side by side with the external connection terminal (hereinafter the first circuit substrate of the present invention).

The present invention is also a circuit substrate including a circuit wiring substrate composed of a support substrate having a circuit wiring and an external connection terminal mounted thereon and an external member attached to the circuit wiring substrate, wherein the external member is connected physically and electrically to the external connection terminal through a conductive member and the circuit wiring includes a fine circuit wiring having a width narrower than a width of the conductive member, and the fine circuit wiring is disposed side by side with the external connection terminal (hereinafter the second circuit substrate of the present invention).

The first and second circuit substrates of the present invention are described in more detail below.

The first circuit substrate of the present invention is composed of a transistor substrate having a support substrate including a transistor and an external connection terminal mounted thereon and an external member attached to the transistor substrate. The second circuit substrate of the present invention is composed of a circuit wiring substrate having a support substrate including a circuit wiring and an external connection terminal mounted thereon and an external member attached to the circuit wiring substrate. The external member is connected to the external connection terminal electrically and physically through a conductive member in both the first and second circuit substrates.

The support substrate is a substrate for mounting circuit elements such as transistors, circuit wiring, and the like. It is preferably made of a material having insulation properties so that a plurality of conductive elements can be mounted. It may also be a conductive substrate having a surface with an insulating film formed thereon. The transistor is a semiconductor element having an amplifying function or a switching function. Bi-polar transistor, field effect transistor (FET), and the like are some examples of the transistor. Types of the transistors are not specifically limited. The circuit wiring is not specifically limited to a particular wiring as long as routing for an electrical connection can be secured. The external connection terminal is a member having conductive properties to allow an electrical connection between a circuit wiring substrate or the transistor substrate and the external member. The external member is a member connected to the circuit wiring substrate or the transistor substrate electrically through the external connection terminal. Examples of the external member are, for example, electronic component such as resistor, capacitor, coil, connector, diode, transistor, or flexible printed circuit (FPC), integrated circuit (IC), chip on glass (COG) or chip on film (COF) including the circuit element and circuit wiring. Printed wiring board (PWB), printed circuit board (PCB), tape carrier package (TCP) are additional examples.

The external member and the external connection terminal described above are connected to each other electrically. Thus, it is necessary to have a conductive member between the external member and the external connection terminal. Further, in order to be connected physically, it is preferable that the conductive member itself has an adhesive property, or the conductive member itself may not have the adhesive property, but the conductive member may preferably be mixed with an adhesive material. An example of the conductive member itself having the adhesive property can be a solder. An example of the conductive member without the adhesive property but mixed with an adhesive material can be an anisotropic conductive film (ACF) having a conductive fine particle inside. Here, the conductive fine particle corresponds to the conductive member. The conductive member is preferably the conductive fine particle inside the anisotropic conductive film. The anisotropic conductive film is preferred because of the adhesiveness of the anisotropic conductive film to a pixel electrode member (ITO: indium tin oxide) when the pixel electrode in a display device is used as a barrier metal (protective metallic film) for an external connection terminal, for example. When the conductive fine particle of the anisotropic conductive film constitutes the conductive member, a single conductive fine particle inside the anisotropic conductive film constitutes one conductive member.

According to the first circuit substrate of the present invention, the transistor is disposed side by side with the external connection terminal. In the present specification, the phrase "disposed side by side with the external connection terminal" indicates an object is disposed without overlapping any part of the external connection terminal region when viewed from a direction perpendicular to a main surface of the substrate. Further, the term "the substrate" in the present specification indicates any of the transistor substrate, the circuit wiring substrate, or the transistor circuit substrate unless otherwise stated. When the transistor substrate and the external connection terminal are to be connected by pressure bonding for example, a certain pressure is usually applied to the transistor substrate and to the external connection terminal. If the transistor is in the region where this pressure is applied, the characteristics of the transistor may deteriorate. Therefore, in the first circuit substrate according to the present invention, the transistor is disposed side by side with the external connection terminal to reduce influences of the pressure so that the transistor can function normally.

According to the second circuit substrate of the present invention, the circuit wiring includes a fine circuit wiring having a width narrower than a width of the conductive member and the fine circuit wiring is disposed side by side with the external connection terminal. The fine circuit wiring having the narrow width is formed in a portion of the wiring circuit which allows an increased integration density of the circuit elements. For example, if the second circuit substrate is adapted to a display device, a frame region which is a part of the circuit substrate that is not a display region, can be reduced. However, as described above, when the circuit wiring substrate is connected to the external connection terminal by pressure bonding with a certain pressure applied, if the fine circuit wiring is positioned in the region where the pressure is applied, deterioration of the characteristics of the fine circuit wiring may occur. Therefore, according to the second circuit substrate of the present invention, the fine circuit wiring is disposed side by side with the external connection terminal so that the influences of the pressure are reduced. Thus, the fine circuit wiring with reduced shorting between the fine circuit wirings, reduced deterioration of the characteristics and proper functionalities can be obtained. The phrase "the fine circuit wiring having a width narrower than a width of the conductive member" indicates that the conductive member can cover the entire width of the circuit wiring when viewed from a direction perpendicular to the main surface of the substrate and if the conductive member overlaps the fine circuit wiring. In other words, the width of the circuit wiring is such that the conductive member can cross the circuit wiring. The second circuit substrate of the present invention is a circuit substrate that does not have any region where the fine circuit wiring overlaps the external connection terminal. In the present specification, the term "width of the conductive member" indicates the width of the conductive member excluding the portion having the adhesive property in the case the conductive member itself does not have the adhesive property. For example, in the case the conductive fine particle inside the anisotropic conductive film constitutes the conductive member, the diameter of the conductive fine particle is defined as width of the conductive member. On the other hand, in the case the conductive member itself has the adhesive property, width of the conductive member is defined as an appropriate width of a portion of the conductive member that is formed continuously and overlapping the fine circuit wiring. When the width of the conductive member is wider than the width of the fine circuit wiring, the fine circuit wiring is likely to be broken due to the pressure from the conductive member overlapping the external connection terminal during ordinary thermal pressure bonding. Thus, it is necessary that the fine circuit wiring as defined above at least does not overlap the external connection terminal.

According to the first and second circuit substrates of the present invention, as long as the circuit substrates are made to include these necessary constituting elements as described above, other constituting elements can either be included or not included. For example, when the transistor substrate or the circuit substrate is adapted to a display device, regions having both the display region including a circuit necessary to control display and the peripheral circuit region having a circuit necessary to control the display region can be formed on one substrate. Thus, this can be made as a monolithic substrate. Types of the transistor circuits formed in the peripheral circuit region are not limited specifically. The transistor circuit can be a driver circuit that includes a transmission gate, latch circuit, timing generator, and power circuit having inverters and other circuits, and it also can be a circuit such as buffer circuit, digital-analog conversion circuit (DAC circuits), shift register, and sampling memory. A driver circuit can be a source driver circuit and gate driver circuit and others.

Preferred embodiments of the first and second circuit substrates according to the present invention are described in detail below.

It is preferable that the external member includes a conductive protrusion in a region overlapping the external connection terminal. Hereinafter, such a conductive protrusion is referred to as "external connection wiring" or "bump". Whole configuration of the circuit substrate can be simplified by providing the external member with a dedicated member for connection to the external connection terminal. By making the dedicated member as a conductive protrusion, the pressure applied can easily be concentrated to the external connection terminal and to the conductive protrusion when the external connection terminal is connected to the external member. This reduces the influences to the transistor and to the fine circuit wiring both disposed side by side with the external connection terminal.

It is preferable that the conductive member and the conductive protrusion serve as a pillar supporting the transistor substrate and the external member. It is also preferable that the conductive member and the conductive protrusion serve as a pillar supporting the circuit wiring substrate and the external member. The conductive member and the conductive protrusion positioned in a region overlapping the external connection terminal are disposed so that they function as the pillar supporting the transistor substrate or the circuit wiring substrate and the external member. This reduces the influences to the transistor and to the fine wiring both disposed side by side with the external connection terminal. The pillar supporting the transistor substrate or the circuit wiring substrate is the portion where the largest pressure is applied when the transistor substrate or the circuit wiring substrate directly overlaps the external member. In the case the conductive member is the conductive fine particle inside the anisotropic conductive film (ACF), the conductive fine particle is well suited to perform the function of the pillar due to its elasticity.

It is preferable that the transistor be positioned in a region overlapping the external member. The fine circuit wiring also is preferably positioned in a region overlapping the external member. According to the configuration of the present invention, even if the external member is disposed in a region overlapping the transistor and the fine circuit wiring in order to have a high integration density, because the transistor and the fine circuit wiring are disposed side by side with the external connection terminal, the influences of the load applied by the pressure is reduced when the external connection terminal is connected to the external member. Accordingly, an area occupied by the circuit elements can be reduced when compared with the case where the transistor is moved away from the external member in order to avoid the influences of the pressure to the transistor and to the fine circuit wiring.

It is preferable that a distance between the transistor substrate and the external member be shorter in a region overlapping the external connection terminal than in a region overlapping the transistor. It is also preferable that a distance between the circuit wiring substrate and the external member be shorter in a region overlapping the external connection terminal than in a region overlapping the fine circuit wiring. In the present specification, the term "region overlapping" indicates a part of the region or the whole region where a particular object overlaps when viewed from a direction perpendicular to the main surface of the substrate. For example, "region overlapping the external connection terminal" indicates a part of the region overlapping the external connection terminal or the entire region overlapping the external connection terminal when viewed from a direction perpendicular to the main surface of the substrate. This concept includes not only a plan view but also includes depth. In this embodiment, thus, a space between the substrate and the external member is such that a thickness is smaller in the region overlapping the external connection terminal than in the region overlapping the transistor or in the region overlapping the fine circuit wiring. This means when the substrate and the external member are pressure bonded, a large pressure is applied to the external connection terminal rather than to the transistor and the fine circuit wiring which in turn reduces the influences to the transistor and to the fine circuit wiring both disposed side by side with the external connection terminal. In the present specification, the term "than" does not include values being compared having the same value.

It is preferable that a distance between the transistor substrate and the external member be the shortest in a region overlapping the external connection terminal. It is also preferable that a distance between the circuit wiring substrate and the external member be the shortest in a region overlapping the external connection terminal. Because a space between the substrate and the external member has the shortest distance above the external connection terminal, the pressure can be concentrated most to the external connection terminal and the pillar supporting the substrate and the external member in the region overlapping the external connection terminal is realized. This reduces the influences to the transistor and to the fine circuit wiring both disposed side by side with the external connection terminal.

It is preferable that the external connection terminal be a laminated body having a plurality of conductive films laminated. Because the external connection terminal has a larger thickness than other members, positioning it as the pillar to support the substrate and the external member can be made easier. Thickness of the external connection terminal can be ensured easily by the external connection terminal formed as a laminated body with the plurality of conductive films laminated. This makes it easier to reduce the influences to the transistor and to the fine circuit wiring both disposed side by side with the external connection terminal.

It is preferable that the laminated body has a conductive film including a material that constitutes the transistor. It is also preferable that the laminated body has a conductive film including a material that constitutes the circuit wiring. As described above, ensuring the thickness of the external connection terminal becomes easier by having the external connection terminal formed as a laminated body with the plurality of conductive films laminated. The transistor and a part of the laminated body of the external connection terminal can be formed together in a single formation step, if a material constituting the transistor in the transistor substrate of the present invention or the circuit wiring in the circuit wiring substrate is included in the laminated body of the external connection terminal. Thus, an efficient configuration can be obtained.

When the transistor substrate of the present invention further includes the circuit wiring, or the circuit wiring substrate of the present invention further includes the transistor, it is preferable that the laminated body has the conductive film that includes a material constituting the circuit wiring and also has the conductive film that includes a material constituting the transistor. Similar to the case as described above, if both the material constituting the transistor and the material constituting the circuit wiring are used to form a part of the laminated body, an even more efficient configuration is possible by having both of the conductive films, one including the material constituting the transistor and the other including the material constituting the circuit wiring.

It is preferable that a distance between the transistor substrate and the external member in the region overlapping the transistor be larger than the diameter of the conductive fine particle, when the conductive member is the conductive fine particle inside the anisotropic conductive film. It is also preferable that that a distance between the circuit wiring substrate and the external member in the region overlapping the fine circuit wiring be larger than the diameter of the conductive fine particle, when the conductive member is the conductive fine particle inside the anisotropic conductive film. As described above, it is preferable that the conductive member used in the present invention be the conductive fine particle inside the anisotropic conductive film. However, from the viewpoint of adhesion of the substrate and the external member, it is preferable that an area where the anisotropic conductive film is disposed be larger. It is preferable that the conductive member be disposed in the region where the anisotropic conductive film overlaps the transistor and/or the fine circuit wiring. If the distance between the circuit substrate above the transistor and/or the fine circuit wiring and the external member is smaller than the diameter of the conductive fine particle, because of the elasticity of the conductive fine particle, a large pressure may be applied to the transistor and to the fine circuit wiring when the circuit substrate is connected to the external member. However, the influences of the pressure from the conductive fine particle can be reduced according to the present embodiment as described above and deterioration of the characteristics of the transistor and the fine circuit wiring can be prevented while maintaining enough adhesion. In the present specification, "the diameter of a fine particle" indicates the largest diameter of a single conductive fine particle. This diameter of a fine particle can be measured using an optical micro scope, for example.

It is preferable that a distance between the transistor substrate and the external member in the region overlapping the external connection terminal be smaller than the diameter of the conductive fine particle, when the conductive member is the conductive fine particle inside the anisotropic conductive film. It is also preferable that that a distance between the circuit wiring substrate and the external member in the region overlapping the external connection terminal be smaller than the diameter of the conductive fine particle, when the conductive member is the conductive fine particle inside the anisotropic conductive film. A certain pressure may be applied to the transistor and/or to the fine circuit wiring because of the influence of the conductive fine particle as described above. A suitable measure to secure a larger width than the diameter of the conductive fine particle in the region overlapping the transistor and/or the fine circuit wiring is as follows. A distance between the substrate in the region overlapping the external connection terminal and the external member, more specifically the thickness of the anisotropic conductive film disposed in the region overlapping the external connection terminal is made smaller than the diameter of the conductive fine particle. An enough distance is secured between other regions of the circuit substrate and the external member by this measure and deterioration of the characteristics of the transistor and the fine circuit wiring can be prevented.

It is preferable that the circuit wiring includes a lead-out wiring with at least one bending portion. The circuit wiring needs to be grouped in an appropriate area as necessary. The circuit wiring can be routed to an appropriate area not just linearly but also by forming a bending portion. A lead-out wiring can easily bypass the external connection terminal by forming a bending portion and formation of the led-out wiring and the external connection terminal being overlapped with each other can be prevented. The number of the bending portions included in the lead-out wiring is not specifically limited. The lead-out wiring can be used to form a wiring such as for transferring signals from the external connection terminal to the display region through the transistor circuit or the like, and for a wiring from the external connection terminal to supply power, for example. The circuit wiring can be routed to an appropriate portion of the display region when the second circuit substrate is adapted to a display device by forming the lead-out wiring, for example. This makes it possible to reduce the frame area. From the viewpoint of the integration density, it is preferable that the lead-out wiring includes the fine circuit wiring. According to the present invention, even if such a fine circuit wiring is formed, deterioration of the characteristics of the fine circuit wiring can be minimized.

It is preferable that the lead-out wiring be further extended from the terminal lead-out wiring which in turn is extended from the external connection terminal. In the present specification the term "terminal lead-out wiring" indicates the wiring directly led-out from the external connection terminal. The terminal lead-out wiring is directly connected to the external connection terminal, and accordingly, a certain width needs to be maintained, leading to less freedom in designing. Reduction of width is preferable for the lead-out wiring from the viewpoint of increasing the integration density and reducing an area of the frame region. Accordingly, by forming the wiring in stages, such as by further extending the lead-out wiring from the terminal lead-out wiring, which was extended from the external connection terminal, more freedom is obtained in designing and the integration becomes easier.

It is preferable that the circuit substrate includes an inorganic insulating film directly underneath a surface on opposite side of a surface of the external connection terminal where the external member is connected. If an organic insulating film of a photosensitive acrylic resin is disposed directly underneath the external connection terminal, this organic insulating film may peel or a scar may be inflicted on the organic insulating film when a rework in the step of connecting the external connection terminal and the external member is needed. A contact failure of the external member may occur due to debris from the peeled organic insulating film. Therefore, for the insulating film disposed directly underneath the external connection terminal, an inorganic insulating film having more rigidity than an organic insulating film is preferred.

It is preferable that the circuit substrate includes a sub pillar to help physically connect the transistor substrate to the external member. It is also preferable that the circuit substrate include a sub pillar to help physically connect the circuit wiring substrate to the external member. For example, when the transistor substrate or the circuit wiring substrate is connected to the external member, a pressure is applied in the region overlapping the external connection terminal in a concentrated manner. This may cause the connection between the transistor substrate or the circuit wiring substrate and the external member to be inadequate. Further, the external member may not be able to connect evenly to the transistor substrate or the circuit wiring substrate. In such a situation, the transistor substrate or the circuit wiring substrate and the external member can be connected evenly with a proper balance by disposing a sub pillar in a needed position appropriately, and then the reliability of the substrate can be improved. A protrusion such as a bump provided in the external member can be such a sub pillar. However, electric conductance of the sub pillar is not specifically limited. It is preferable that the sub pillar be disposed so that it does not overlap the conductive member from the viewpoint of reducing the influences to the transistor and the fine circuit wiring.

It is preferable that the external connection terminals be arranged so that a plurality of the external connection terminals are disposed side by side forming a sequence of lines linearly or in a zigzag manner. In the case that the circuit substrate includes a plurality of the external connection terminals, it is preferable that these external connection terminals be disposed in a single line from the viewpoint of increasing the integration density. It is also preferable that such a single line of the terminals be disposed along a side of the external member so that the external connection terminals are grouped together even more and further increase in the integration density can be realized.

It is preferable that the circuit substrate include an input external connection terminal and an output external connection terminal and the input external connection terminals and the output external connection terminals are disposed alternately and forming a line. This embodiment is a preferable configuration when a plurality of the external connection terminals are divided based on output and input uses. In the case that the plurality of the external connection terminals are arranged on a single substrate, forming a single line is preferable from the viewpoint of increasing the integration density. However, when they are used in a single circuit the input external connection terminals and the output external connection terminals can be disposed alternately so that the circuit can be easily pointed in one direction. This allows the device configuration to be more efficient and improves the integration density.

It is preferable that the circuit substrate be a circuit substrate for a display device having the display region and the peripheral circuit region, and the external member be disposed in the peripheral circuit region. In the case the circuit substrate of the present invention is used as a display device circuit substrate, an area of the peripheral circuit region can be decreased significantly without deteriorating the characteristics of the circuit elements such as transistors. Therefore, a display device having a small frame area and a good performance can be obtained when the circuit substrate is adapted to the display device.

It is preferable that the lead-out wiring be extended from the external connection terminal in a direction away from the display region and further extended toward the display region through a bending portion. The lead-out wiring may preferably be extended initially from the external connection terminal in a reverse direction to the display region depending on a design of the circuit substrate. Even in such a case, the lead-out wiring can be formed efficiently according to the configuration of the circuit substrate of the present invention.

Further, the present invention is a circuit substrate including a transistor circuit substrate composed of a support substrate having a circuit wiring and a transistor circuit including a transistor and an external connection terminal mounted thereon and an external member attached to the transistor circuit substrate, wherein the external member is connected physically and electrically to the external connection terminal through a conductive member and the transistor circuit is disposed side by side with the external connection terminal (hereinafter referred to as the third circuit substrate of the present invention).

The third circuit substrate of the present invention is an embodiment including the features of the transistor provided in the first circuit substrate of the present invention. Thus, the third circuit substrate of the present invention can adopt any of the preferred embodiments of the first circuit substrate of the present invention as described above. When the circuit wiring provided by the third circuit substrate of the present invention includes the fine circuit wiring as in the second circuit substrate of the present invention, any of the preferred embodiments of the second circuit substrate of the present invention as described above can be adopted. It is preferable that the circuit wiring provided by the third circuit substrate of the present invention includes the fine circuit wiring so that an area occupied by the circuit wiring can be reduced while maintaining the functionality of the circuit wiring.

It is preferable that a plurality of the transistor circuits be disposed side by side forming a single line. It is also preferable that a plurality of the external connection terminals be disposed side by side forming a single line. When the circuit substrate includes a plurality of the transistor circuits or the external connection terminals, it is preferable that each of these pluralities of the transistor circuits or the external connection terminals be disposed side by side forming a single line from a view point of increasing the integration density.

It is preferable that the transistor circuits and the external connection terminals be disposed alternately forming a line. When the circuit substrate includes a plurality of the transistor circuits and a plurality of the external connection terminals, it is preferable that they be disposed alternately and side by side to form a "complex" row from the view point of connecting the transistor circuits and the external connection terminals efficiently and reducing an area occupied by these.

The present invention is a display device having the circuit substrate, wherein the circuit substrate includes the display region and the peripheral circuit region, and the external member is disposed in the peripheral circuit region. When the first, second, or third circuit substrate of the present invention is adapted to the display device, deterioration of the characteristics of the transistor and the circuit wiring is minimized and a display device with a reduced frame area can be obtained.

Effects of the Invention

According to a configuration of a circuit substrate of the present invention, a transistor and/or fine circuit wiring are disposed side by side with an external connection terminal. Consequently, the influence that the pressure applied when pressure-bonding an external member to the external connection terminal might have on the transistor and/or fine circuit wiring can effectively be reduced. As a result, it is possible to minimize the deterioration of the characteristics of the transistor and the fine circuit wiring. Also, when a circuit substrate of the present invention is used in a display device, for example, the frame area can be reduced without deteriorating the characteristics of the transistor and fine circuit wiring.

DETAILED DESCRIPTION OF EMBODIMENTS

Embodiments of the present invention are described below, and the present invention is explained further in detail with reference to figures. The present invention, however, is not limited to such embodiments.

Embodiment 1

Figure 1:
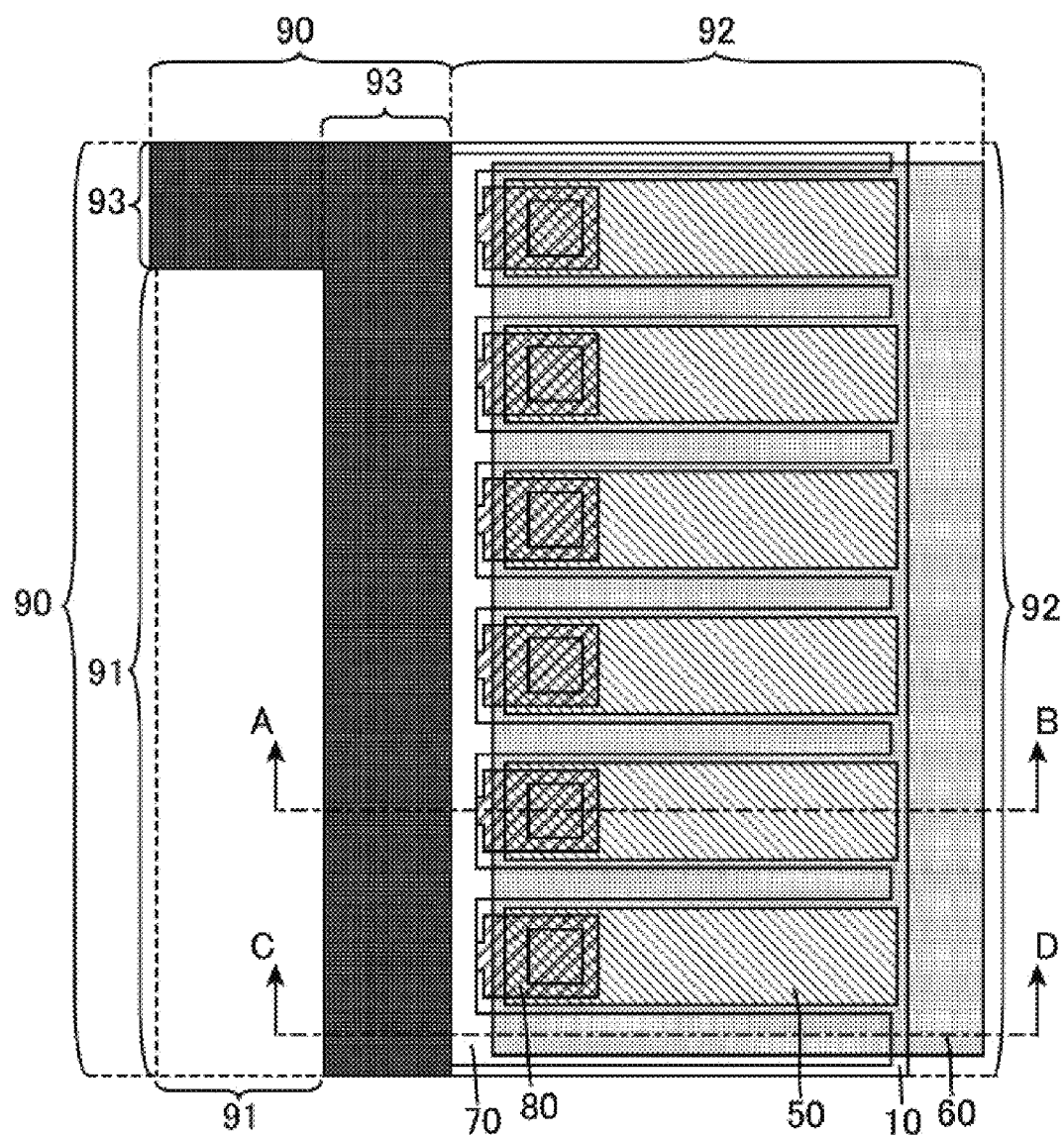
FIG. 1 is a schematic plan view of a circuit substrate according to Embodiment 1 of the present invention.

FIG. 1 is a schematic plan view of a circuit substrate according to Embodiment 1. The circuit substrate according to Embodiment 1 is a first circuit substrate of the present invention in the respect that it includes a transistor substrate having a transistor and an external connection terminal; is a second circuit substrate of the present invention in the respect that it includes a circuit wiring substrate having a circuit wiring with a fine circuit wiring and an external connection terminal; and is a third circuit substrate of the present invention in the respect that it includes a transistor circuit substrate having a circuit wiring, a transistor, and an external connection terminal.

As shown in FIG. 1, the circuit substrate of Embodiment 1 is composed of a display region 90 and a peripheral circuit region 92. The display region 90 is composed of a pixel region 91 and a seal region 93 surrounding the pixel region 91. In the circuit substrate of Embodiment 1, a circuit is formed in both the display region 90 and the peripheral circuit region 92. This means that the circuit substrate is a full monolithic type circuit substrate that includes a single support substrate having thereon a circuit for controlling a display element and a peripheral circuit for controlling the circuit that controls the display element. Also, the circuit substrate has an external member 60 in the peripheral circuit region 92, and therefore it is a circuit substrate composed of a transistor circuit substrate 10 having a support substrate with a plurality of circuits mounted thereon and an external member 60 which is connected to the transistor circuit substrate 10. As described above, the display region 90 that can control the display element and the peripheral circuit region 92 that controls the display region 90 are configured on the single transistor circuit substrate 10. Therefore, a circuit substrate of Embodiment 1 is preferably used as a substrate for a display device.

A plurality of external connection terminals 50 connected to an external member 60 are arranged side by side with each other in the peripheral circuit region 92, and are lined up along a boundary line between the display region 90 and the peripheral circuit region 92. A circuit (hereinafter also referred to as transistor circuit) 70 having a circuit wiring and a transistor is connected to each of the external connection terminals 50 through a terminal lead-out wiring 80. The external connection terminal 50 is connected to the pixel region 91 which constitutes the display region 90 through the transistor circuits 70. The transistor circuits 70 are also arranged side by side with each other, and are lined up along the boundary line between the display region 90 and the peripheral circuit region 92. A plurality of these transistor circuits 70 are unified near the boundary line between the display region 90 and the peripheral circuit region 92. The plurality of transistor circuits 70 connected together in this way constitutes a single large circuit. Types of the transistor circuit 70 formed in the peripheral circuit region 92 are not specifically limited. A transistor circuit 70 can be, for example, a driver circuit that includes a transmission gate, latch circuit, timing generator, and power circuit having inverters and other circuits, and it also can be a circuit such as buffer circuit, digital-analog conversion circuit (DAC circuit), shift register, and sampling memory. A driver circuit can be a source driver circuit and gate driver circuit. Since the external connection terminal 50 is disposed side by side with the transistor circuit 70, they are not disposed so as to actually overlap each other.

As described above, both the external connection terminals 50 and the transistor circuits 70 are lined up along the boundary line of the display region 90 and the peripheral circuit region 92, and are arranged alternately to form a "complex" row composed of the transistor circuits 70 and the external connection terminals 50. In order to reduce the area of the peripheral circuit region 92, the row composed of the transistor circuits 70 and the external connection terminals 50 are formed in a region of the peripheral circuit region 92 on the side relatively close to the display region 90. However, it is necessary to secure a larger area for the transistor circuit 70 than for the external connection terminal 50, and therefore, the transistor circuits 70 are formed over a larger area that extends towards the frame side which is away from the display region 90. Considering the constraint that requires the external connection terminals 50 and the transistor circuits 70 to be disposed side by side so that they do not overlap each other, the configuration in which the external connection terminals 50 and the transistor circuits 70 are arranged alternately side by side is an efficient arrangement because it reduces area (frame area) of the peripheral circuit region 92.

Each of the plurality of external connection terminals 50 is connected to the external member 60. Each of the external connection terminals 50 is made of a conductive material, and when overlapped with a conductive member used in the external member 60, it can be electrically connected to it. In Embodiment 1, a flexible printed circuit board (FPC) 60 equipped with a conductive protrusion (bump or external connection wiring) is used for the external member 60. Examples of the external member 60 in Embodiment 1 are, besides FPC, electronic components composed of circuit elements such as a resistor, capacitor, coil, connector, diode, and transistor, or chips (COG or COF) with an integrated circuit (IC) having such circuit elements mounted thereon. Additionally, printed wiring board (PWB), printed circuit board (PCB), and tape carrier package (TCP) can also be an external member 60.

In the peripheral circuit region 92, the flexible printed circuit board (FPC) 60 connected to the external connection terminals 50 overlaps both the external connection terminal 50 and the transistor circuit 70 when viewed from a direction perpendicular to a main surface of the transistor circuit substrate 10. This configuration effectively reduces the area of the peripheral circuit region 92 (frame area). On the other hand, in the circuit substrate of Embodiment 1, the external connection terminals 50 and the transistor circuit 70 are disposed side by side, i.e. without actually overlapping each other, when viewed from a direction perpendicular to the main surface of the transistor circuit substrate 10. With this configuration, short-circuiting in a fine circuit wiring and deterioration of the characteristics of the transistor in the transistor circuit due to a pressure load applied to the transistor circuit 70 when the FPC 60 is pressure-bonded to the transistor circuit substrate 10 can be suppressed, even if the FPC 60 is disposed so that it overlaps the transistor circuit 70.

A seal region 93 of the display region 90 is where a sealing material for bonding a plurality of parts constituting a display element together is used, and does not actually contribute to display. On the other hand, a pixel region 91 of the display region 90 is where a plurality of pixels, each of which is a unit constituting the display region 90, are formed. This region does actually contribute to display. Due to the fact that the plurality of pixels are formed in the display region 90 and each pixel is driven and controlled by the transistor circuit formed within the pixel region 91, a high-resolution and high-quality display can be obtained. Further, the transistor circuit 70 formed within the peripheral circuit region 92 can serve as a driver block circuit that further controls the drive control of the pixel region 91.

Figure 2:
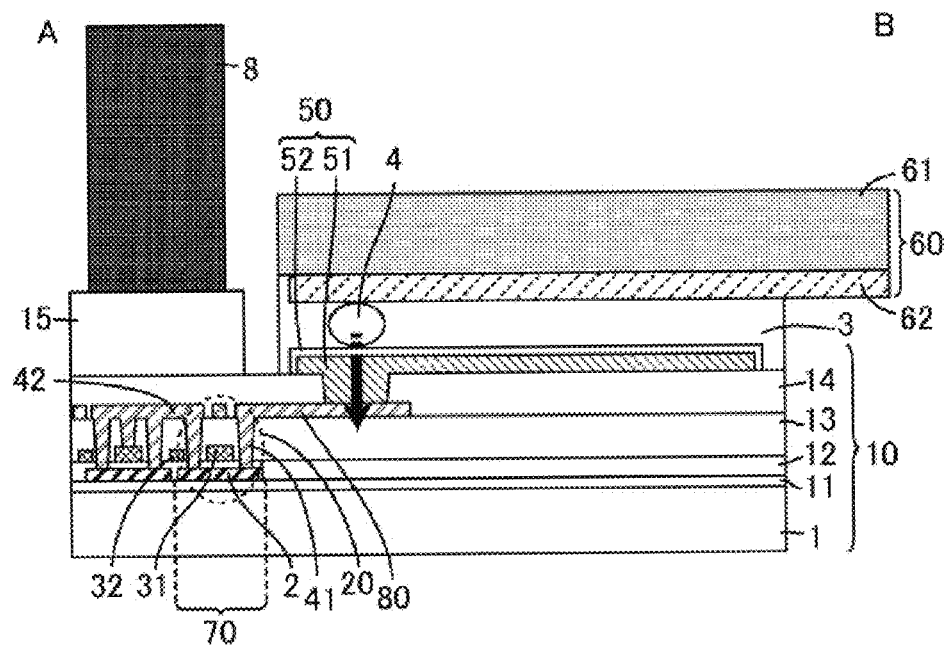
FIG. 2 is a schematic cross-sectional view along the line A-B in FIG. 1 of the circuit substrate according to Embodiment 1.

FIG. 2 is a schematic cross-sectional view along the line A-B in FIG. 1 of the circuit substrate according to Embodiment 1. The cross sectional view along the line A-B includes the external connection terminal. As shown in FIG. 2, a base coat film (first insulating film) 11 is formed on an entire surface of a support substrate 1 of the transistor circuit substrate 10 according to Embodiment 1, and various wirings, transistors, external connection terminals, and the like are disposed through insulating films as necessary, on the base coat film. The support substrate 1 can preferably be a material having an insulating film, for example, glass, resin, or the like. Also, the support substrate 1 may be a conductive substrate having an insulating film formed on a surface of the conductive substrate.

As the transistor, thin film transistors (TFT) 20, which are three terminal type field effect transistors (FETs), are used. In Embodiment 1, the transistor circuit substrate 10 has a plurality of TFTs 20, and each of the plurality of TFTs 20 has a semiconductor layer 2, and three electrodes including a gate electrode 31, a source electrode and a drain electrode. Between the semiconductor layer 2 and the gate electrode 31, a gate insulating film (second insulating film) 12 is formed, and the semiconductor layer 2, the second insulating film 12, and the gate electrode 31 are stacked in this order from the support substrate 1. A circuit wiring 32 composed of the same material as the gate electrode 31 is formed on a side of the TFT 20 on the same layer as the gate electrode 31. On the gate electrode 31, an inorganic interlayer insulating film (third insulating film) 13 made of one or more layer(s) is formed also. A source electrode and a drain electrode 41 are disposed on the third insulating film 13. They are connected electrically to the semiconductor layer 2 through contact holes formed in a multi-layer insulating film made of the second insulating film 12 and the third insulating film 13. A part of the source electrode and a part of the drain electrode 41 are extended to form a circuit wiring 42 connecting adjacent TFTs. The TFT 20 is connected to the external connection terminal 50 through the terminal lead-out wiring 80, which is an extension of the source electrode or the drain electrode 41.

An insulating film on the source electrode and the drain electrode 41 is an organic interlayer insulating film (fourth insulating film) 14. Another organic interlayer insulating film (fifth insulating film) 15 is formed on the fourth insulating film 14, and a sealing member 8 is disposed on the fifth insulating film 15.

The external connection terminal 50 is made of a laminated body by laminating a plurality of conductive films. In Embodiment 1, the laminated body of the external connection terminal 50 provided on the transistor circuit substrate 10 is made by laminating a first conductive film 51 and a second conductive film 52. The first conductive film is made by laminating aluminum (Al) and molybdenum (Mo) or Indium Zinc Oxide (IZO) in this order from the support substrate 1. The second conductive film 52 is made of Indium Tin Oxide (ITO). The same materials as the materials (Al, Mo, IZO) used to make other circuit elements of a peripheral circuit region, or circuit elements of a pixel region, and the same materials as the material (ITO) used to make a pixel electrode are used. Therefore, for example, the circuit wiring and a part of the laminated body of the external connection terminal can be formed in one manufacturing step. Accordingly, this is an efficient configuration. The external connection terminal is designed to have a width of 300-3000 μm in the longitudinal direction and a width of 20-300 μm in a horizontal direction when viewed from a direction perpendicular to a main surface of the substrate. A wiring width of the terminal lead-out wiring 80 is 5-350 μm when viewed from the direction perpendicular to the main surface of the substrate.

The external connection terminal 50 is connected to an external member FPC 60. The FPC 60 is composed of a support substrate 61 and a bump (conductive protrusion) 62 formed on the support substrate 61. The FPC 60 includes the bump 62 in a region overlapping the external connection terminal 50. An anisotropic conductive film (ACF) 3 and a conductive fine particle 4, which electrically and physically connect the bump 62 to the external connection terminal 50, are disposed between the bump 62 and the external connection terminal 50. The ACF 3 is disposed so that each of the external connection terminals 50 does not electrically connect with others. The bump 62 provided with the FPC 60 of Embodiment 1 is a wiring provided with the FPC 60. It is made of, for example, copper (Cu), gold (Au), or the like. According to Embodiment 1, a width of the wiring (bump) 62 is 20-300 μm when viewed from a direction perpendicular to the main surface of the substrate. The thickness of the wiring (bump) is 1-50 μm. The ACF 3 may be made of conductive fine particle 4 made from a resin ball with a diameter of 2-10 μm, plated with nickel (Ni), gold (Au), or the like, which are mixed at a certain ratio with a resin composition of epoxy, acrylic or the like and a thermal cure reactant. The ACF 3 can serve as an adhesive by applying a certain heat to the resin composition. Accordingly, the ACF 3 is attached to the external connection terminal 50 provided on the transistor circuit substrate 10 and to the bump 62 provided on the FPC 60, occupying the space in-between. Accordingly, the transistor circuit substrate 10 can be connected to the FPC 60 electrically and physically by thermal bonding applying a certain pressure while applying a certain heat.

As described above, the external connection terminal 50 and the FPC 60 can be unified by pressure bonding. However, an overlapped portion of the external connection terminal 50, ACF 3 and bump 62 can serve as a pillar supporting the transistor circuit substrate 10 and the FPC (external member) 60, and the greatest pressure is applied in this region during pressure bonding. This pillar portion has the shortest distance between the transistor circuit substrate 10 and the FPC 60. During pressure bonding, the distance between the external connection terminal 50 and the bump 62 becomes shorter than the diameter of the conductive fine particle 4. A shape of the conductive fine particle 4 inside the ACF 3, which is positioned in a region overlapping the external connection terminal, becomes elliptic because of this pressure as shown in FIG. 2, and a certain pressure is applied on the external connection terminal 50 in the direction of the black arrow as shown in FIG. 2. If the transistor circuit 70 overlaps the external connection terminal 50, deterioration of the characteristics of a fine circuit wiring inside the transistor circuit 70 and a transistor 20 can occur due to the pressure from the pressure bonding. According to Embodiment 1, however, the transistor circuit 70 and the external connection terminal 50 are disposed side by side and are not overlapping with each other. Therefore, shorting of the circuit wiring and deterioration of the characteristics of the transistor 20 due to the pressure bonding of the transistor substrate 10 and the FPC 60 can be suppressed.

Figure 3:
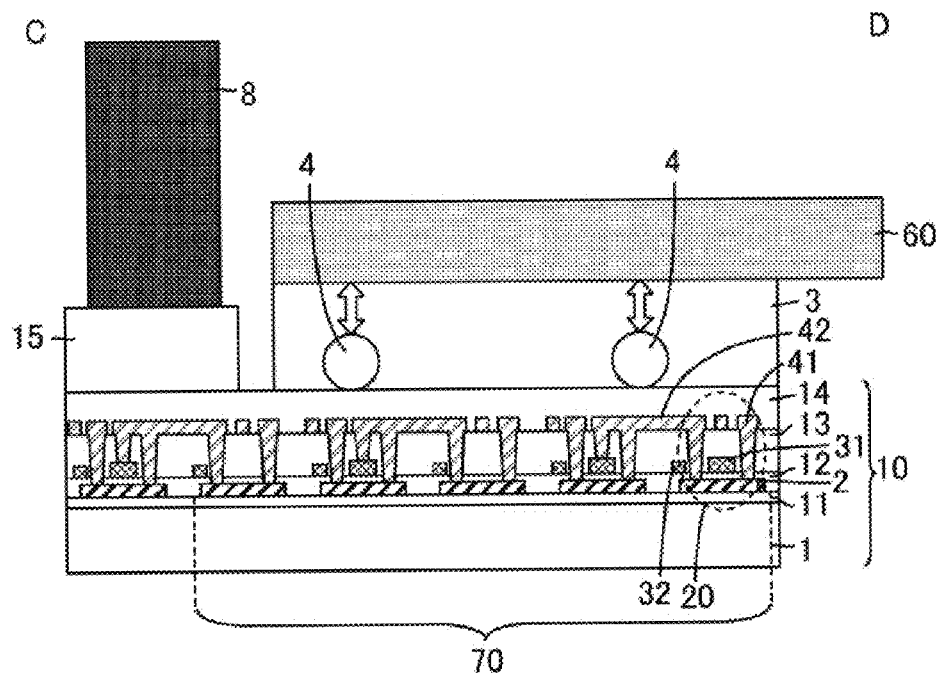
FIG. 3 is a schematic cross-sectional view along the line C-D in FIG. 1 of the circuit substrate according to Embodiment 1.

FIG. 3 is a schematic cross-sectional view along the line C-D in FIG. 1 of the circuit substrate according to Embodiment 1. The cross sectional view along the line C-D includes circuit wiring and transistors. As shown in FIG. 3, the transistor circuit substrate 10 is composed of the transistor circuit 70 including a plurality of transistors 20, and the FPC 60 is disposed in a position overlapping the transistor circuit 70. The ACF 3 is formed between the transistor circuit substrate 10 and the FPC 60. A distance between the transistor circuit substrate 10 and the FPC 60 in a region overlapping the transistor 20 is longer than a distance between the transistor circuit substrate 10 and the FPC 60 in a region overlapping the external connection terminal 50. Accordingly, as shown by the white arrow in FIG. 3, enough space is formed in ACF 3 in a region overlapping the transistor circuit 70 such that influences on the transistor circuit 70 positioned in a lower layer of being compressed by the conductive fine particle 4 is small. Accordingly, even if the FPC 60 is pressure bonded to the external connection terminal 50, the pressure applied to the transistor circuit 70 is small in this region. Because the bump 62 as shown in FIG. 2 (cross-sectional view along the line A-B) is sufficiently pressure bonded to the external connection terminal 50 physically and electrically, there is no need to exert the same pressure as applied between the external connection terminal and the FPC in the region overlapping the transistor circuit 70.

Embodiment 2

Figure 4:
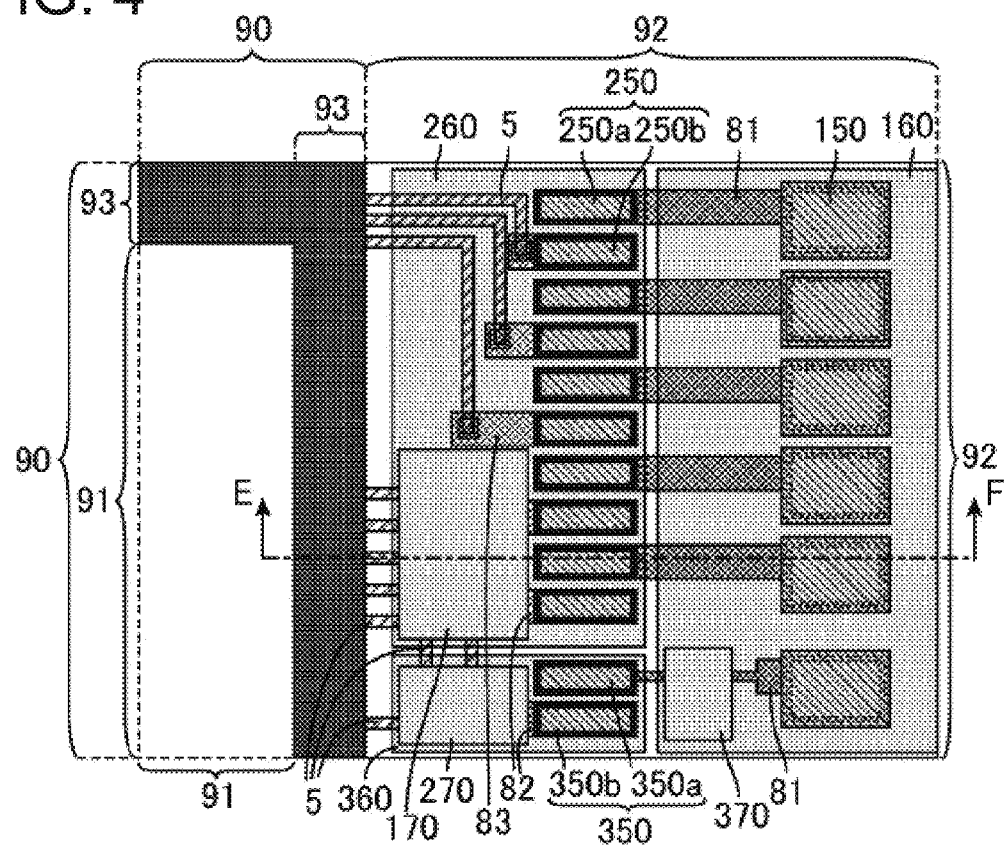
FIG. 4 is a schematic plan view of a circuit substrate according to Embodiment 2.

FIG. 4 is a schematic plan view of a circuit substrate according to Embodiment 2. The circuit substrate according to Embodiment 2 is a first circuit substrate of the present invention in the respect that it includes a transistor substrate having a transistor and an external connection terminal: is a second circuit substrate of the present invention in the respect that it includes a circuit wiring substrate having a circuit wiring with a fine circuit wiring and an external connection terminal: and is a third circuit substrate of the present invention in the respect that it includes a transistor circuit substrate having circuit wiring, a transistor, and an external connection terminal.

As shown in FIG. 4, the circuit substrate according to Embodiment 2 is composed of a display region 90 and a peripheral circuit region 92. The display region 90 is composed of a pixel region 91 and a seal region 93 surrounding the pixel region 91. In the circuit substrate of Embodiment 2, a circuit is formed in both the display region 90 and the peripheral circuit region 92. This means that the circuit substrate is a full monolithic type circuit substrate that includes a single support substrate having thereon a circuit for controlling a display element and a peripheral circuit for controlling the circuit that controls the display element. Also, the circuit substrate has three external members, flexible printing substrate (FPC) 160, COG 260 with an IC mounted thereon, and an individual electronic component 360, such as a resistor, capacitor, coil, connector, diode, and transistor, in the peripheral circuit region 92, and therefore it is a circuit substrate composed of a transistor circuit substrate 10 having a support substrate with a plurality of circuits mounted thereon and external members which are connected to the transistor circuit substrate 10. As described above, the display region 90 that can control the display element and the peripheral circuit region 92 that controls the display region 90 are configured on the single transistor circuit substrate 10. Therefore, the circuit substrate of Embodiment 2 is preferably used as a substrate for a display device.

The external connection terminals provided on the circuit substrate of Embodiment 2 can be divided into three types including a first external connection terminal 150 connected to the FPC 160, a second external connection terminal 250 connected to the COG 260 and a third external connection terminal 350 connected to the electronic component 360. The plurality of external connection terminals 150, 250, and 350 are arranged side by side with each other in the peripheral circuit region 92 and lined up along a boundary line between the display region 90 and the peripheral circuit region 92 forming a plurality of lines. Having these external connection terminals 150, 250, and 350 lined up each in a single line is preferable from the viewpoint of increasing the integration density and reducing the area of the frame region. In the circuit substrate of Embodiment 2, two lines composed of the external connection terminals are lined up. Both of these two lines are disposed along a side of each of the external members 160, 260, and 360. Of these, the line of the external connection terminals positioned closer to a frame side of the transistor circuit substrate 10 is composed of the first external connection terminals 150: and the line of the external connection terminals positioned closer to a side of the display region 90 of the circuit substrate 10 is composed of the second external connection terminals 250 and the third external connection terminals 350. As each of the external members is disposed to overlap the respective external connection terminal, a narrow frame region is realized. In FIG. 4, all of these lines of the external connection terminals are formed as straight lines. However, as long as a sequence of lines can be formed, the external connection terminals can be arranged in a zigzag manner.

A first terminal lead-out wiring 81 is placed between the first external connection terminal 150 and the second external connection terminal 250 or the third external connection terminals 350. The first terminal lead-out wiring 81 is a wiring extended in a direction from the first external connection terminal 150 toward the pixel region 91.

In the peripheral circuit region 92, two circuits (transistor circuit) including transistors and circuit wiring are lined up side by side with each other along a boundary line of the display region 90 and the peripheral circuit region 92. One of the circuits is a transistor circuit (hereinafter referred to as first transistor circuit) 170 disposed to overlap the COG 260 and the other one is a transistor circuit (hereinafter referred to as second transistor circuit) 270 disposed to overlap the electronic component 360. A lead-out wiring 5 is formed between the first transistor circuit 170 and the second transistor circuit 270. A large circuit is composed by connecting these circuits with each other. A transistor circuit (hereinafter referred to as third transistor circuit) 370 is formed between the first external connection terminal 150 and the third external connection terminal 350. The first lead-out wiring 81 is divided into two by the third transistor circuit 370. Types of the transistor circuits formed in the peripheral circuit region 92 are not limited specifically. The transistor circuit can be a driver circuit that includes a transmission gate, latch circuit, timing generator, and power circuit having inverters and other circuits, and it also can be circuit such as buffer circuit, digital-analog conversion circuit (DAC circuits), shift register, and sampling memory. A driver circuit can be a source driver circuit and gate driver circuit and others.

The second external connection terminal 250 is connected to other adjacent second external terminal 250 through the COG 260. The second external connection terminal that is connected directly to the first terminal lead-out wiring 81 is an input external connection terminal 250a, and the other adjacent second external connection terminal is an output external connection terminal 250b. The second external connection terminal (output external connection terminal) 250b is connected to the first transistor circuit 170 through the second terminal lead-out wiring 82 extended from the second external connection terminal (output external connection terminal) 250b toward the pixel region 91. The first transistor circuit 170 is connected to the pixel region 91 by the lead-out wiring 5 extended from the first transistor circuit 170. A plurality of lead-out wirings 5 are extended from the first transistor circuit 170 toward the pixel region 91 in straight lines (shortest distance).

The third external connection terminal 350 is connected to other adjacent third external connection terminal through the electronic component 360. The third external connection terminal that is connected directly to the first terminal let-out wiring 81 is an input external connection terminal 350a, and the other adjacent third external connection terminal is an output external connection terminal 350b. The third external connection terminal (output external connection terminal) 350b is connected to the second transistor circuit 270 through the second terminal lead-out wiring 82 extended from the third external connection terminal (output external connection terminal) 350b toward the pixel region 91. The second transistor circuit 270 is connected to the pixel region 91 by the lead-out wiring 5 extended from the second transistor circuit 270. The lead-out wiring 5 is extended from the second transistor circuit 270 toward the pixel region in a straight line (shortest distance).

The first external connection terminal 150 according to Embodiment 2 is designed to have a width of 300-3000 μmin in the longitudinal direction and a width of 20-300 μm in the lateral direction when viewed from a direction perpendicular to the main surface of the substrate. The second external connection terminal 250 and the third external connection terminal 350 are both designed to have a width of 50-500 μm in the longitudinal direction and a width of 20-100 μm in the lateral direction when viewed from a direction perpendicular to the main surface of the substrate. When comparing the second connection terminal 250 to the third external connection terminal 350, their areas are comparable, and when comparing the first external connection terminal 150 to the second external connection terminal 250 and the third external connection terminal 350, the first external connection terminal 150 has a larger area.

For the second external connection terminal 250 and the third external connection terminal 350 of Embodiment 2, the input external connection terminals 250a, 350a and the output external connection terminals 250b, 350b are disposed side by side alternately, and they are disposed close together on a frame area side (opposite to the pixel region 91) of the COG. Thus, a circuit can easily be designed to have a single direction, and further increase in the integration density and reduction of an area of the frame region are possible.

Some of the second external connection terminals (output external connection terminal) 250b are connected to the pixel region 91 bypassing the transistor circuit. The second external connection terminal (output external connection terminal) 250b connected to the pixel region 91 bypassing the transistor circuit is connected to the pixel region through the third terminal lead-out wiring 83 and the lead-out wiring 5 connected to the third terminal lead-out wiring 83. The lead-out wiring 5 is a fine circuit wiring and is disposed side by side with the external connection terminal to actually avoid overlapping the external connection terminal. In this embodiment of the present invention, a conductive fine particle in the anisotropic conductive film (ACF) is used as a conductive member as described below. This single conductive fine particle constitutes a single conductive member. The conductive member has a width wide enough to cross the lead-out wiring 5 (fine circuit wiring) when overlapping the lead-out wiring (fine circuit wiring) 5. The width of the conductive member is about 2-10 μm. The frame region can be reduced by forming the lead-out wiring 5 narrow. The line width of the lead-out wiring 5 of Embodiment 2 is 2-3 nm in narrow portions. The lead-out wiring 5 is designed such that the lead-out wiring 5 is concentrated in an appropriate area of the pixel region 91 by bending perpendicularly after extending to a certain length. The third terminal lead-out wiring 83 extending from the second external connection terminal (output external connection terminal) 250b has an extension length different from that of the third terminal lead-out wiring 83 extending from an adjacent second external connection terminal (output external connection terminal) 250b. The lead-out wiring 5 can be formed efficiently by changing the lengths as described above, and the integration density increase and reduction of the frame area can be realized.

According to Embodiment 2, connections from the FPC 160 to the pixel region utilizes three types of paths described below. The first path is a connection from the FPC 160 to the pixel region 91 through the first external connection terminal 150, the first terminal lead-out wiring 81, the second external connection terminal (input external connection terminal) 250a, COG 260, the second external connection terminal (output external connection terminal) 250b, the second terminal lead-out wiring 82, the first transistor circuit 170, and the lead-out wiring 5. The second path is a connection from the FPC 160 to the pixel region 91 through the first external connection terminal 150, the first terminal lead-out wiring 81, the second external connection terminal (input external connection terminal) 250a, COG 260, the second external connection terminal (output external connection terminal) 250b, the third terminal lead-out wiring 83 and the lead-out wiring 5. The third path is a connection from the FPC 160 to the pixel region 91 through the first external connection terminal 150, the first terminal lead-out wiring 81, the third transistor circuit 370, the first terminal lead-out wiring 81, the third external connection terminal (input external connection terminal) 350a, the electronic component 360, the third external connection terminal (output external connection terminal) 350b, the second terminal lead-out wiring 82, the second transistor circuit 270, and the lead-out wiring 5.

As described above, (1) the transistor circuit and the external connection terminal are disposed side by side without overlapping each other when viewed from a direction perpendicular to the main surface of the transistor circuit substrate, (2) the external connection terminals are arranged in a series of lines along one side of the external member, (3) the input external connection terminal and the output external connection terminal connected to each other through the external member are disposed alternately and adjacent to each other, (4) the input external connection terminal and the output external connection terminal connected to each other through the external member are both disposed on a frame side of the COG (opposite side to the pixel region), and (5) the external member is disposed to overlap a circuit element such as a transistor. These measures can prevent possible shorting of the fine circuit wiring and deterioration of the characteristics of transistors when the external connection terminal and the external member are pressure bonded, and can reduce an area of the peripheral circuit region.

A plurality of pixels are formed in the pixel region 91, and wiring extended from the peripheral circuit region is connected to each of the pixels. A plurality of wirings are thus disposed in the pixel region. Each of the wirings in the pixel region may have a transistor disposed appropriately, for example, to function as a switching element to drive the pixel. The first transistor circuit 170 and the second transistor circuit 270 formed in the peripheral circuit region can be a driver block circuit to further control a drive control of the pixel region 91.

Figure 5:
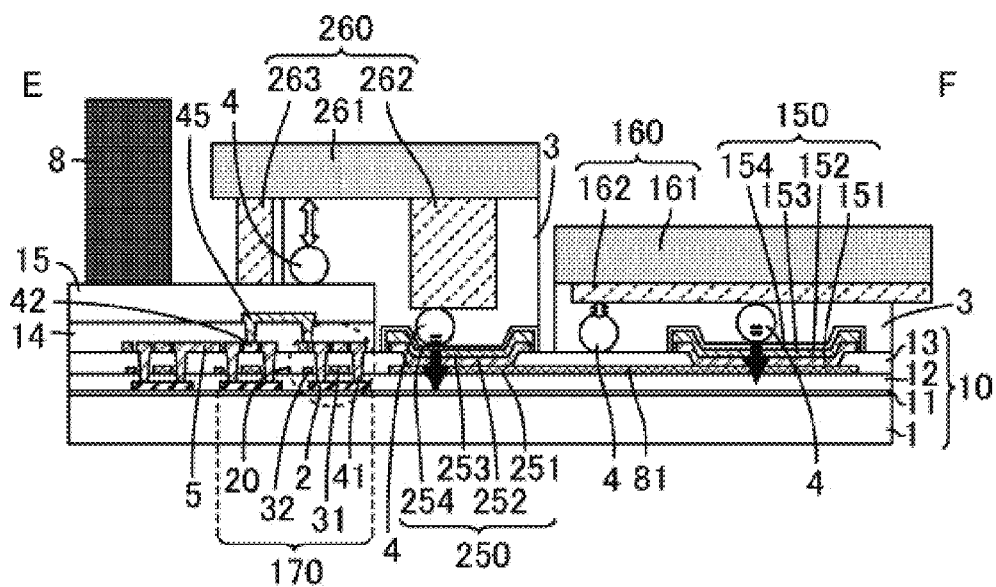
FIG. 5 is a schematic cross-sectional view along the line E-F in FIG. 4 of the circuit substrate according to Embodiment 2.

FIG. 5 is a schematic cross-sectional view along the line E-F in FIG. 4 of the circuit substrate according to Embodiment 2. As shown in FIG. 5, in the transistor circuit substrate 10 according to Embodiment 2, a base coat film (first insulating film) 11 is formed on an entire surface of the support substrate 1, and various wiring, transistors, external connection terminals, and the like are disposed through an insulating film appropriately, and composed on the base coat film. The support substrate 1 can preferably be a material having an insulating film, for example, glass, resin, or the like. Also, the support substrate 1 may be a conductive substrate having an insulating film formed on a surface of the conductive substrate.

The transistor can be a thin film transistor (TFT) 20, which is a three terminal type field effect transistor (FET). In Embodiment 2, the transistor circuit substrate 10 has a plurality of TFTs 20, and each of the plurality of TFTs 20 has a semiconductor layer 2, and three electrodes including a gate electrode 31, a source electrode and a drain electrode. Between the semiconductor layer 2 and the gate electrode 31, a gate insulating film (second insulating film) 12 is formed, and the semiconductor layer 2, the second insulating film 12, and the gate electrode 31 are stacked in this order from the support substrate 1. A circuit wiring 32 composed of the same material as the gate electrode 31 is formed on a side of the TFT 20 on the same layer as the gate electrode 31. On the gate electrode 31, an inorganic interlayer insulating film (third insulating film) 13 made of one or more layer(s) is formed also. The source electrode and drain electrode 41 are disposed on the third insulating film 13. They are connected electrically to the semiconductor layer 2 through contact holes formed in a multi-layer insulating film made of the second insulating film 12 and the third insulating film 13. A circuit wiring 42 composed of the same material as the source electrode and the drain electrode 41 is formed on the same layer as the source electrode and the drain electrode 41 in a location adjacent to the TFT. A portion of the circuit wiring 42 is extended to become the lead-out wiring 5 and is connected to the pixel region 91.

An insulating film on the source electrode and the drain electrode 41 is an organic interlayer insulating film (fourth insulating film) 14. Another organic interlayer insulating film (fifth insulating film) 15 is formed on the fourth insulating film 14, and a sealing member 8 is disposed on the fifth insulating film 15. A TFT upper circuit wiring 45 is disposed on the fourth insulating film 14, connecting the neighboring TFTs 20 with each other through contact holes formed in the fourth insulating film 14.

The external connection terminals provided on the transistor circuit substrate of Embodiment 2 are grouped into three types including a first external connection terminal 150, a second external connection terminal 250, and a third external connection terminal 350. The cross-sectional view along the line E-F includes the first external connection terminal 150 and the second external connection terminal 250. The first external connection terminal 150 and the second external connection terminal 250 are both composed of a laminated body including a plurality of laminated conductive films. The laminated body includes materials that are used to compose the TFT 20 and the circuit wiring 32 and 42. From the support substrate 1, a conductive film 251 including the material that composes the gate electrode 31, a conductive film 252 including the material that composes the source electrode and drain electrode 41, a conductive film 253 which includes the material that composes the TFT upper wiring 45 and a conductive film 254 having transparency and used in the pixel region 91 are laminated in this order to compose the laminated body. The external connection terminal 150, 250, and 350 provided on the transistor substrate 10 according to Embodiment 2 may include a conductive film formed of materials other than the ones described above.

The conductive film 251 including the material that composes the gate electrode has a laminated structure with a tantalum (Ta) layer and tungsten (W) layer laminated in this order from the support substrate 1. The thickness of the tantalum (Ta) layer is 50 nm and the thickness of the tungsten (W) layer is 350 nm. The conductive film 252 including the material that composes the source electrode and drain electrode 41 has a laminated structure with a titanium (Ti) layer, aluminum (Al) layer and titanium (Ti) layer laminated in this order from the support substrate 1. The thicknesses of the titanium (Ti) layers are both 100 nm, and the thickness of the aluminum (Al) layer is 500 nm. The conductive layer 253 including the material that composes the TFT upper wiring 45 has a laminated structure with an aluminum (Al) layer and molybdenum (Mo) layer laminated in this order from the support substrate 1. The thickness of the aluminum (Al) layer is 400 nm, and the thickness of the molybdenum (Mo) layer is 100 nm. The conductive film 254 having transparency and used in the pixel region 91 is composed of the ITO layer. The thickness of the ITO layer is 100 nm.

The external connection terminals 150, 250 formed by laminating conductive films can maintain a certain film thickness in order to shorten a distance between the external members 160, 260 and the transistor circuit substrate 10. A region that overlaps the external connection terminals 150, 250 can be the portion having the shortest distance between the transistor circuit substrate 10 and the FPC 160 or COG 260. The external connection terminals 150, 250 formed by laminating conductive films according to Embodiment 2 are composed of materials used to form other composition elements such as transistor circuits and pixel electrodes. Therefore, manufacturing of these would not necessitate other manufacturing steps and is efficient.

The FPC 160 according to Embodiment 2 is composed of a support substrate 161, and an external connection wiring (conductive protrusion) 162 formed on the support substrate 161. The COG 260 is composed of a support substrate 261 and a bump (conductive protrusion) 262 formed on the support substrate 261. The first external connection terminal 150 is connected to the FPC 160, and the second external connection terminal 250 is connected to the COG 260. The external connection terminal 150 and the FPC 160 are connected to each other through the anisotropic conductive film (ACF) 3 and the conductive fine particle 4, which are disposed between the external connection wiring 162 and the external connection terminal 150 and are connecting the external connection wiring 162 to the external connection terminal 150 physically and electrically. The external connection terminal 250 and the COG 260 are connected to each other through the anisotropic conductive film (ACF) 3 and the conductive fine particle 4, which are disposed between the bump 262 and the external connection terminal 250 and are connecting the bump 262 to the external connection terminal 250 physically and electrically. The ACF 3 is disposed so that the external connection terminals 150, 250, 350 are not connected with each other electrically. Also, instead of using the conductive fine particle 4 in the ACF 3 as a conductive member, a solder, for example, can be used. The external connection wiring 162 provided on the FPC 160 according to Embodiment 2 is a wiring formed on the support substrate 161. It is composed of copper (Cu), gold (Au), or the like, for example. The bump 262 provided on the COG 260 is an electrode formed on the support substrate 261. It is composed of copper (Cu), gold (Au), or the like for example.

The width of the external connection wiring 162 connected to the first external connection terminal 150 is 50-300 μm when viewed from a direction perpendicular to the main surface of the substrate, and the thickness of the external connection wiring 162 is 1-100 μm. The width of the bump 262 connected to the second external connection terminal 250 is 1-100 μm when viewed from a direction perpendicular to the main surface of the substrate, and the thickness of the bump 262 is 2-10 μm. For the external connection wiring 162, 262, either a new dedicated electrode or wiring added to the external member, or the original electrode or wiring provided with the external member can be used. For the ACF 3, a conductive fine particle 4 made from a resin ball with a diameter of 2-10 μm, plated with nickel (Ni), gold (Au), or the like, and mixed at a certain ratio with a resin composition having epoxy or acrylic, or the like and a thermal cure reactant, can be used. The ACF 3 can serve as an adhesive by applying a certain heat to such a resin composition. Accordingly, the ACF 3 is attached to the external connection terminals 150, 250 provided on the transistor circuit substrate 10, to the external connection wiring 162 provided on the FPC 160, and to the bump 262 provided on the COG 260, and accordingly, the transistor circuit substrate 10 can be connected to the FPC 160 and the COG 260 electrically and physically by thermal pressure bonding applying a certain pressure while applying a certain heat.

As described above, the external connection terminals 150, 250 and the FPC 160 and the COG 260 can be unified by pressure bonding. However, an overlapped portion of three parts, namely, the external connection terminal 150, ACF 3 and external connection wiring 162, and an overlapped portion of three parts, namely, the external connection terminal 250, ACF 3 and bump 262, can serve as pillars connecting the FPC 160 and the COG 260 and the transistor circuit substrate 10, respectively, and the greatest pressure is applied in those regions in the direction of the black arrows as shown in FIG. 5. If the transistor circuit 170 overlaps the external connection terminals 150, 250, deterioration of the characteristics of the fine circuit wiring inside the transistor circuit 170 and the transistor can occur due to the pressure of the pressure bonding. According to Embodiment 2, however, the transistor circuit 170 and the external connection terminals 150, 250 are disposed side by side and not actually overlapping with each other. Therefore, shorting of the fine circuit wiring and deterioration of the characteristics of the transistor due to the pressure bonding of the external connection terminals 150, 250 and the FPC 160 or the COG 260 can be suppressed.

The COG 260 is disposed in a region overlapping the transistor circuit 170 according to Embodiment 2. The FPC 160 is disposed in a region overlapping the first terminal lead-out wiring 81 extending from the first external connection terminal 150. The AFC 3 is formed between the transistor circuit substrate 10 and the FPC 160 and between the transistor circuit substrate 10 and the COG 260 even in the region overlapping the transistor circuit and in the region overlapping the terminal lead-out wiring. However, inside the AFC 3, there is enough space with a height greater than the diameter of the conductive fine particle 4. Therefore, a load applied by pressure to the transistor circuit substrate 10, i.e., the transistor circuit 170 and the terminal lead-out wiring (circuit wiring) 81 formed beneath, is small when the FPC 160 and the COG 260 are pressure bonded to the external connection terminals 150, 250. Also, the external connection wirings 162, 262 are sufficiently pressure bonded physically and electrically to the external connection terminals 150 250. Thus, it is not necessary to exert the same amount of load as applied between the external connection terminals 150, 250 and the FPC 160 or the COG 260 in the region where the transistor circuit 170 is disposed.

A dummy bump 263, which is smaller than the bump 262 serving as a pillar, is provided on the fifth insulating film 15 in a region overlapping the COG 260 on the circuit substrate according to Embodiment 2. The width of this dummy bump 263 is 2-20 μm when viewed from a direction perpendicular to the main surface of the substrate, and the thickness of the dummy bump is 5-20 μm. The dummy bump 263 is disposed so as to occupy open spaces on circuits below to reduce the influences on the fine circuit wiring and the transistors formed below during pressure bonding. The dummy bump 263 is provided as a secondary pillar to the bump 262, which is positioned in the region overlapping the external connection terminal 250 and is serving as a main pillar, so that the COG 260 is disposed on the transistor circuit substrate 10 so as to face each other in parallel in a balanced manner. Here, the dummy bump 263 is not disposed through the ACF 3. Therefore, influences on the conductive fine particle 4 inside the ACF of being pressured by the dummy bump during pressure bonding are small.

Embodiment 3

Figure 6:
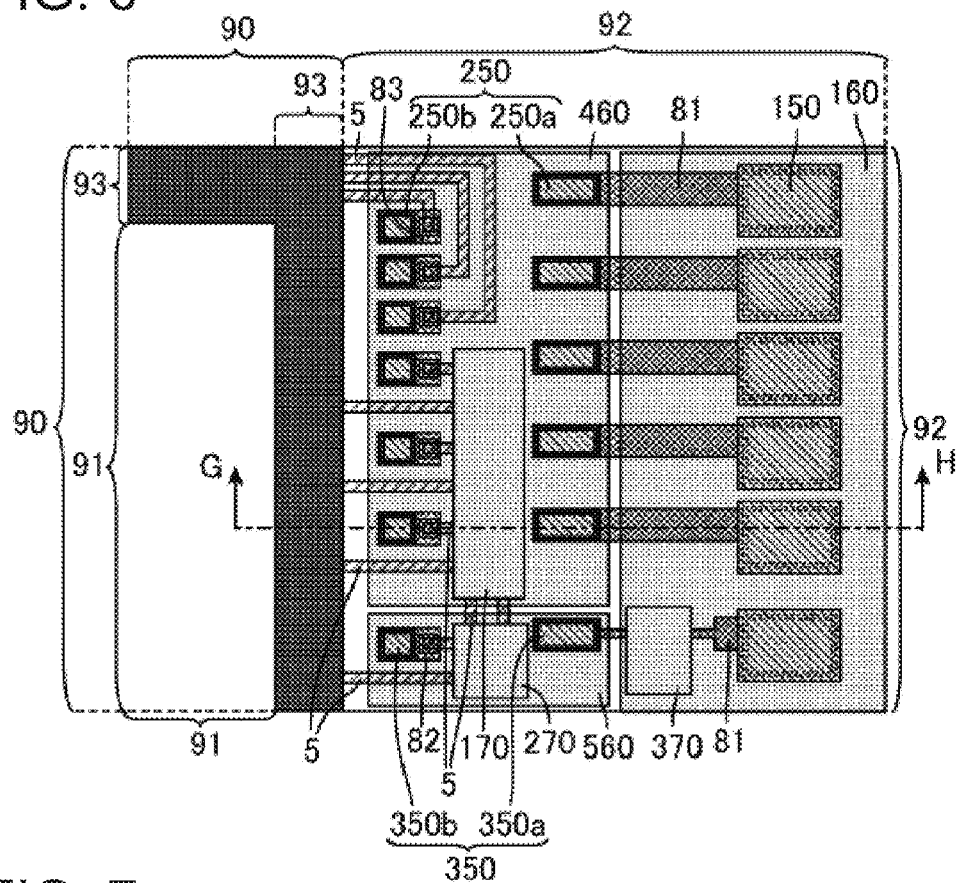
FIG. 6 is a schematic plan view of a circuit substrate according to Embodiment 3.

FIG. 6 is a schematic plan view of a circuit substrate according to Embodiment 3. The circuit substrate according to Embodiment 3 is a first circuit substrate of the present invention in the respect that it includes a transistor substrate having a transistor and an external connection terminal; is a second circuit substrate of the present invention in the respect that it includes a circuit wiring substrate having a circuit wiring with a fine circuit wiring and an external connection terminal; and is a third circuit substrate of the present invention in the respect that it includes a transistor circuit substrate having a circuit wiring, a transistor, and an external connection terminal.

As shown in FIG. 6, the circuit substrate according to Embodiment 3 is composed of a display region 90 and a peripheral circuit region 92. The display region 90 is composed of a pixel region 91 and a seal region 93 surrounding the pixel region 91. In the circuit substrate of Embodiment 3, a circuit is formed in both the display region 90 and the peripheral circuit region 92. This means that the circuit substrate is a full monolithic type circuit substrate that includes a single support substrate having thereon a circuit for controlling a display element and a peripheral circuit for controlling the circuit that controls the display element. Also, the circuit substrate has three external members, flexible printing substrate (FPC) 160, COG 460 with an IC mounted thereon, and an individual electronic component 560, such as a resistor, capacitor, coil, connector, diode, and transistor, in the peripheral circuit region 92, and therefore it is a circuit substrate composed of a transistor circuit substrate 10 having a support substrate with a plurality of circuits mounted thereon and external members, which are connected to the transistor circuit substrate 10. As described above, the display region 90 that can control the display element and the peripheral circuit region 92 that controls the display region 90 are configured on the single transistor circuit substrate 10. Therefore, the circuit substrate of Embodiment 3 is preferably used as a substrate for a display device.

The external connection terminals provided on the circuit substrate of Embodiment 3 can be divided into three types including a first external connection terminal 150 connected to the FPC 160, a second external connection terminal 250 connected to the COG 460 and a third external connection terminal 350 connected to the electronic component 560. The plurality of external connection terminals 150, 250, and 350 are arranged side by side with each other in the peripheral circuit region 92 and lined up forming a plurality of lines along a boundary line between the display region 90 and the peripheral display region 92. Three lines composed of the external connection terminals are formed on the circuit substrate according to Embodiment 3. All of the three lines are disposed along one side of each of the external members 160, 460, 560. Of these lines, the line that is positioned on a side of the transistor circuit substrate 10 closest to the frame is composed of the first external connection terminals 150. The two lines that are positioned on a side closest to the display region 90 are composed of the second external connection terminals 250 and the third external connection terminals 350. Because each of the external members is disposed to overlap the external connection terminals, reduction of the frame region area is realized. In FIG. 6, all of these lines of the external connection terminals are formed as straight lines. However, as long as a sequence of lines can be formed, the external connection terminals can be arranged in a zigzag manner.

A first terminal lead-out wiring 81 is placed between the first external connection terminal 150 and the second external connection terminal 250 or the third external connection terminals 350. The first terminal lead-out wiring 81 is a wiring extended in a direction from the first external connection terminal 150 to the pixel region 91.

Two circuits (transistor circuit) including transistors and circuit wiring are lined up side by side with each other along a boundary line of the display region 90 and the peripheral circuit region 92. One of the circuits is a first transistor circuit 170 disposed to overlap the COG 460, and the other one is a second transistor circuit 270 disposed to overlap the electronic component 560. A lead-out wiring 5 is formed between the first transistor circuit 170 and the second transistor circuit 270. A large circuit can be composed by connecting these circuits with each other. A third transistor circuit 370 is formed between the first external connection terminal 150 and the third external connection terminal 350. The first lead-out wiring 81 is divided into two by the third transistor circuit 370. Types of the transistor circuits formed in the peripheral circuit region 92 are not limited specifically. The transistor circuit can be a driver circuit that includes a transmission gate, latch circuit, timing generator, and power circuit having inverters and other circuits, and it also can be a circuit, such as buffer circuit, digital-analog conversion circuit (DAC circuits), shift register, and sampling memory. A driver circuit can be a source driver circuit and gate driver circuit and others.

The second external connection terminal 250 is connected through the COG 460 to other second external terminal positioned on an opposite side sandwiching the first transistor circuit 170. The second external connection terminal that is connected directly to the first terminal lead-out wiring 81 is an input external connection terminal 250a, and the other second external connection terminal on the opposite side is an output external connection terminal 250b. The second external connection terminal (output external connection terminal) 250b is connected to the first transistor circuit 170 through the second terminal lead-out wiring 82 extended from the second external connection terminal (output external connection terminal) 250b toward the frame (reverse direction to the pixel region). The first transistor circuit 170 is connected to the pixel region 91 by the lead-out wiring 5 connected to the first transistor circuit 170. A plurality of the lead-out wirings 5 are extended from the first transistor circuit 170 toward the pixel region 91 with straight lines (shortest distance).

The third external connection terminal 350 is connected through the electronic component 560 to other third external connection terminal positioned in an opposite side sandwiching the second transistor circuit 270. The third external connection terminal that is connected directly to the first terminal lead-out wiring 81 is an input external connection terminal 350a, and the other third external connection terminal on the opposite side is an output external connection terminal 350b. The third external connection terminal (output external connection terminal) 350b is connected to the second transistor circuit 270 through the second terminal lead-out wiring 82 extended from the third external connection terminal (output external connection terminal) 350a toward the frame (reverse direction to the pixel region). The second transistor circuit 270 is connected to the pixel region 91 by the lead-out wiring 5 connected to the second transistor circuit 270. A plurality of lead-out wirings 5 are extended from the second transistor circuit 270 toward the pixel region 91 in straight lines (shortest distance).

The first external connection terminal 150 according to Embodiment 3 is designed to have a width of 300-3000 µm in the longitudinal direction and a width of 20-300 µm in the lateral direction when viewed from a direction perpendicular to the main surface of the substrate. The second external connection terminal 250 and the third external connection terminal 350, and the input external connection terminals 250a, 350a are all designed to have a width of 400-800 µm in the longitudinal direction and a width of 100-300 µm in the lateral direction when viewed from a direction perpendicular to the main surface of the substrate. The output external connection terminals 250b, 350b are all designed to have a width of 100-200 µm in the longitudinal direction and a width of 20-40 µm in the lateral direction when viewed from a direction perpendicular to the main surface of the substrate. When comparing the area of the second connection terminal 250 and that of the third external connection terminal 350, their areas are comparable for the output external connection terminals 250a, 350a, and for the output external connection terminals 250b, 350b, their areas are comparable. On the other hand, when comparing the input external connection terminals 250a, 350a to the output external connection terminals 250b, 350b, the input external connection terminals 250a, 350a have larger areas. When comparing the first external connection terminal 150, the second external connection terminal 250, and the third external connection terminal 350, the first external connection terminal 150 has a larger area.

Some of the second external connection terminals (output external connection terminal) 250b are connected to the pixel region 91 bypassing the transistor circuit. The second external connection terminal (output external connection terminal) 250b connected to the pixel region 91 bypassing the transistor circuit is connected to the pixel region 91 through the third terminal lead-out wiring 83 and the lead-out wiring 5 connected to the third terminal lead-out wiring 83. The third terminal lead-out wiring 83 extended from the second external connection terminal (output external connection terminal) 250b is extended in a direction toward the frame (reverse direction to the pixel region). Thus, the lead-out wiring 5 connected to the third terminal lead-out wiring 83 is designed to bypass the second external connection terminal (output external connection terminal) 250b by bending at a right angle twice and is routed to an appropriate part of the pixel region 91. In Embodiment 3, the lead-out wiring 5 is extended from the external connection terminal in a direction away from the pixel region 91 (display region 90), and then, the lead-out wiring 5 is routed through two bending paths and extended toward the pixel region 91 (display region 90). The lead-out wiring 5 is a fine circuit wiring and is disposed side by side with the external connection terminal to actually avoid overlapping the external connection terminal. In the present embodiment, the conductive fine particle in the anisotropic conductive film (ACF) is used as a conductive member as described below. This single conductive fine particle constitutes a single conductive member. The conductive member has a width wide enough to cross the lead-out wiring 5 (fine circuit wiring) when overlapping the lead-out wiring 5. The width of the conductive member is about 2-10 µm. The frame region area can be reduced by forming the lead-out wiring 5 narrow. The line width of the lead-out wiring 5 of Embodiment 3 is 2-3 nm in narrow portions.

In Embodiment 3, connections from the FPC 160 to the pixel region utilize three types of paths as described above. The first path is a connection from the FPC 160 to the pixel region through the first external connection terminal 150, the first terminal lead-out wiring 81, the second external connection terminal (input external connection terminal) 250a, COG 460, the second external connection terminal (output external connection terminal) 250b, the third terminal lead-out wiring 83, the first transistor circuit 170, and the lead-out wiring 5. The second path is a connection from the FPC 160 to the pixel region through the first external connection terminal 150, the first terminal lead-out wiring 81, the second external connection terminal (input external connection terminal) 250a, COG 460, the second external connection terminal (output external connection terminal) 250b, the third terminal lead-out wiring 83 and the lead-out wiring 5. The third path is a connection from the FPC 160 to the pixel region through the first external connection terminal 150, the first terminal lead-out wiring 81, the third transistor circuit 370, the first terminal lead-out wiring 81, the third external connection terminal (input external connection terminal) 250a, the electronic component 560, the third external connection terminal (output external connection terminal) 250b, the third terminal lead-out wiring 83, the second transistor circuit 270, and the lead-out wiring 5.

As described above, (1) the transistor circuit and the external connection terminal are disposed side by side without overlapping each other when viewed from a direction perpendicular to the main surface of the transistor circuit substrate, (2) the external connection terminals are arranged side by side along one side of the external member, (3) the external connection terminals connected to each other through the external member are disposed to sandwich the transistor circuit and facing each other, and (4) the external member is disposed to overlap a circuit element such as a transistor. These measures can prevent shorting of the fine circuit wiring and deterioration of the characteristics of transistors when the external connection terminal and the external member are pressure bonded, and can reduce the area of the peripheral circuit region.

A plurality of pixels are formed in the pixel region 91, and wiring extended from the peripheral circuit region 92 is connected to each of the pixels. A plurality of wirings are thus disposed in the pixel region 91. Each of the wirings may have a transistor disposed appropriately, for example, to function as a switching element to drive the pixel in the pixel region 91. The first transistor circuit 170 and the second transistor circuit 270 formed in the peripheral circuit region 92 can be driver block circuits to further control a drive control of the pixel region.

Figure 7:
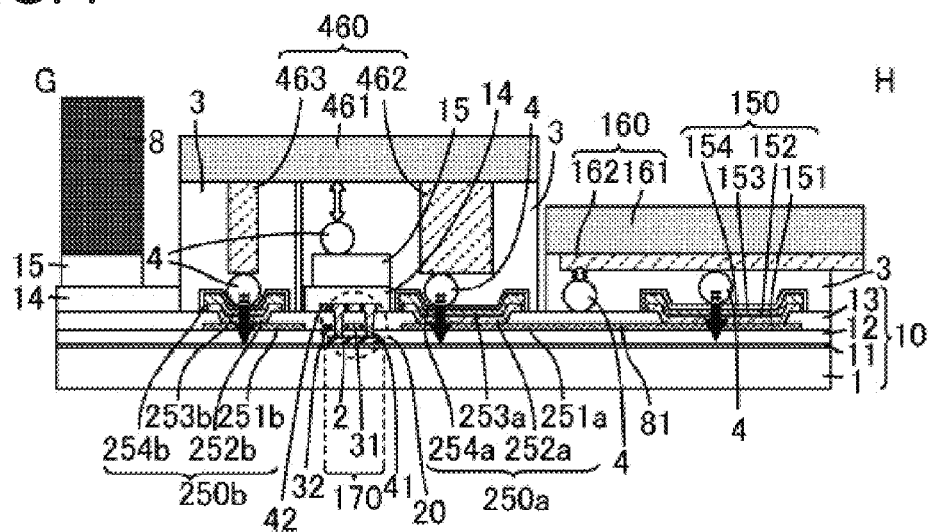
FIG. 7 is a schematic cross-sectional view along the line G-H in FIG. 6 of the circuit substrate according to Embodiment 3.

FIG. 7 is a schematic cross-sectional view along the line G-H in FIG. 6 of the circuit substrate according to Embodiment 3. As shown in FIG. 7, in the transistor circuit substrate 10 according to Embodiment 3, a base coat film (first insulating film) 11 is formed on an entire surface of the support substrate 1, and various wiring, transistors, external connection terminals and the like are disposed through insulating films appropriately on the base coat film. The support substrate 1 can preferably be a material having an insulating film, for example, glass, resin or the like. Also, the support substrate 1 may be a conductive substrate having an insulating film formed on a surface of the conductive substrate.

A transistor can be a thin film transistor (TFT) 20 which is a three terminal type field effect transistor (FET). In Embodiment 3, the transistor circuit substrate 10 has a plurality of TFTs 20, and each of the plurality of TFTs 20 has a semiconductor layer 2, and three electrodes including a gate electrode 31, a source electrode and a drain electrode. Between the semiconductor layer 2 and the gate electrode 31, a gate insulating film (second insulating film) 12 is formed, and the semiconductor layer 2, the second insulating film 12, and the gate electrode 31 are laminated in this order from the support substrate 1. A circuit wiring 32 composed of the same material as the gate electrode 31 is formed on a side of the TFT in the same layer as the gate electrode. On the gate electrode 31, an inorganic interlayer insulating film (third insulating film) 13 made of one or more layer(s) is formed also. The source electrode and drain electrode 41 are disposed on the third insulating film 31. They are connected electrically to the semiconductor layer 2 through contact holes formed in a multi-layer insulating film made of the second insulating film 12 and the third insulating film 13. A circuit wiring 42 composed of the same material as the source electrode and the drain electrode 41 is formed on the same layer as the source electrode and the drain electrode 41 disposed thereon in a location adjacent to the TFT of the same layer. A portion of the circuit wiring 42 is extended to compose the TFT upper wiring and connects neighboring TFTs with each other.

An insulating film on the source electrode and the drain electrode 41 is an organic interlayer insulating film (fourth insulating film) 14. Another organic interlayer insulating film (fifth insulating film) 15 is formed on the fourth insulating film 14, and a sealing member 8 is disposed on the fifth insulating film 15.

The external connection terminals provided on the transistor circuit substrate of Embodiment 3 can be grouped into three types including a first external connection terminal 150, a second external connection terminal 250 and a third external connection terminal 350. The cross-sectional view along the line G-H includes the first external connection terminal 150 and the second external connection terminal 250. The second external terminal 250 can further be grouped into an input external connection 250a and an output external connection terminal 250b. The first external connection terminal 150 and the second external connection terminal 250 are both composed of a laminated body including a plurality of laminated conductive films. The laminated body includes materials that are used to compose the TFT 20 and the circuit wiring 32 and 42. From the support substrate 1, conductive films 151, 251a, 251b, including the material that composes the gate electrode 31, conductive films 152, 252a, 252b including the material that composes the source electrode and drain electrode 41, conductive films 153, 253a, 253b including the material that composes the TFT upper wiring and conductive films 154, 254a, 254b having transparency and used in the pixel region 91 are laminated in this order to compose the laminated body. The external connection terminal 150 and 250 may include a conductive film formed of materials other than the ones described above.

The first external connection terminal 150 and the second external connection terminal 250 are connected to each other through the first terminal lead-out wiring 81. The material that composes the first terminal lead-out wiring 81 is constituted of a conductive film including the material that composes the gate electrode 31.

The conductive film 151, 251a, 251b including the material that composes the gate electrode 31 has a laminated structure with a tantalum (Ta) layer and tungsten (W) layer laminated in this order from the support substrate 1. The thickness of the tantalum (Ta) layer is 50 nm and the thickness of the tungsten (W) layer is 350 nm. The conductive film 152, 252a, 252b including the material that composes the source electrode and drain electrode 41 has a laminated structure with a titanium (Ti) layer, aluminum (Al) layer, and titanium (Ti) layer laminated in this order from the support substrate 1. The thicknesses of the titanium (Ti) layers are both 100 nm, and the thickness of the aluminum (Al) layer is 500 nm. The conductive films 153, 253a, 253b including the material that composes the TFT upper wiring have a laminated structure with an aluminum (Al) layer and molybdenum (Mo) layer laminated in this order from a glass substrate. The thickness of the aluminum (Al) layer is 400 nm, and the thickness of the molybdenum (Mo) layer is 100 nm. The conductive film 154, 254a, 254b having transparency and used in the pixel region 91 is composed of the ITO layer. The thickness of the ITO layer is 100 nm.

The FPC 160 according to Embodiment 3 is composed of a support substrate 161 and an external connection wiring (conductive protrusion) 162 formed on the support substrate 161. The COG 460 is composed of a support substrate 461 and bumps (conductive protrusion) 462, 463 formed on the support substrate 461. The first external connection terminal 150 is connected to the FPC 160 and each of the second external connection terminals 250a, 250b is connected to the COG 460. The FPC 160 includes the external connection wiring 162 in a region overlapping the first external connection terminal 150. The external connection terminal 150 and the FPC 160 are connected to each other through the anisotropic conductive film (ACF) 3 and the conductive fine particle 4, which are disposed between the external connection wiring 162 and the external connection terminal 150 and are connecting the external connection wiring 162 to the external connection terminal 150 physically and electrically. The COG 460 includes the bumps 462, 463 in regions overlapping the external connection terminals. The external connection terminals 250 and the COG 460 are connected to each other through the anisotropic conductive film (ACF) 3 and the conductive fine particle 4, which are disposed between the bumps 462, 463 and the external connection terminals 250a, 250b and are connecting the bump 462 to the external connection terminals 250a, 250b physically and electrically. The ACF 3 is disposed so that the external connection terminals 150, 250, 350 are not connected with each other electrically. Also, instead of using the conductive fine particle 4 in the ACF 3 as the conductive member, a solder, for example, can be used. The external connection wiring 162 provided on the FPC 160 according to Embodiment 3 is a wiring formed on the support substrate 161. It is composed of copper (Cu), gold (Au) or the like, for example. The bumps 462, 463 provided on the COG 460 are electrodes formed on the support substrate 461. Each of them is composed of copper (Cu), gold (Au) or the like, for example.

The width of the external connection wiring 162 connected to the first external connection terminal 150 is 50-300 μm when viewed from a direction perpendicular to the main surface of the substrate, and the thickness of the external connection wiring 162 is 1-100 μm. The width of the bump 462 connected to the second external connection terminal 250 is 20-100 μm when viewed from a direction perpendicular to the main surface of the substrate, and the thickness of the bump 462 is 1-100 μm. The width of the bump 463 connected to the second external connection terminal 250 is 20-100 μm when viewed from a direction perpendicular to the main surface of the substrate, and the thickness of the bump 463 is 1-100 μm. For the external connection wiring 162 and the bumps 462, 463, either a new dedicated electrode or wiring added to the external member, or the original electrode or wiring provided with the external member can be used. For the ACF 3, a conductive fine particle 4 made from a resin ball with a diameter of 2-10 μm, plated with nickel (Ni), gold (Au) or the like and mixed at a certain ratio with a resin composition having epoxy, acrylic or the like and a thermal cure reactant, can be used. The ACF 3 can serve as an adhesive by applying a certain amount of heat to such a resin composition. Accordingly, the ACF 3 is attached to the external connection terminals 150, 250a, 250b provided on the transistor circuit substrate 10, to the FPC 160, and to the external connection wiring 162 or the bumps 462, 463 provided on the COG 460, occupying the space in-between. Accordingly, the transistor circuit substrate 10 is connected to the FPC 160 and to the COG 460 electrically and physically by thermal bonding applying a certain pressure while applying a certain heat.

As described above, the external connection terminal 150, 250a, 250b and the FPC 160 and the COG 260 can be unified by pressure bonding. During pressure bonding, a certain amount of pressure is applied to the external connection terminal in the direction of the black arrows as shown in FIG. 7.

In Embodiment 3, external connection terminals 150, 250a, 250b formed by laminating conductive films can maintain a certain film thickness in order to shorten a distance between the external members 160, 460 and the transistor circuit substrate 10. Regions that overlap the external connection terminals 150, 250a, 250b can be the portions having the shortest distance between the transistor circuit substrate 10 and the external members 160, 460. The regions where the external connection terminals 150, 250a, 250b are disposed can serve as pillars to connect the transistor circuit substrate 10 and the external member 160, 460, and the largest pressure load is applied to these regions during pressure bonding. In areas where the external members 160, 460 overlap the transistor circuit substrate 10, which constitutes the circuit substrate of Embodiment 3, the portions where the external connection terminals 150, 250a, 250b, ACF 3 and the external connection wiring 162 or the bump 462, 463 overlap can serve as pillars to support the transistor circuit substrate 10 and the external members 160, 460. The external connection terminals 150, 250 formed by laminating conductive films according to Embodiment 3 are composed of materials used to form other constituting elements such as transistor circuits, and pixel electrodes. Therefore, manufacturing of these would not necessitate other manufacturing steps and is efficient.

Deterioration of the characteristics of the fine circuit wiring and the transistor in the transistor circuit 170 may occur due to pressure during the pressure bonding if the transistor circuit 170 and the external connection terminals 150, 250a, 250b are overlapping each other. According to Embodiment 3, the transistor circuit 170 and the external connection terminals 150, 250a, 250b are disposed side by side and are effectively not overlapping with each other. Therefore, shorting between the circuit wirings and deterioration of the characteristics of the transistor due to the pressure bonding of the external connection terminals 150, 250a, 250b and the external members 160, 460 can be suppressed.

The COG 460 is disposed in a region overlapping the transistor circuit 170 in Embodiment 3. The FPC 160 is disposed in a region overlapping the terminal lead-out wiring 81 extending from the first external connection terminal 150. The AFC 3 is formed between the transistor circuit substrate 10 and the FPC 160 and the COG 460 even in the region overlapping the transistor circuit and in the region overlapping the terminal lead-out wiring. Inside the AFC 3, there is enough space with a height greater than the diameter of the conductive fine particle 4. Therefore, a load applied by pressure to the transistor circuit substrate 10, that is, the transistor circuit 170 and the terminal lead-out wiring (circuit wiring) 81 formed beneath, is small when the FPC 160 and the COG 460 are pressure bonded to the external connection terminals 150, 250a, 250b. The external connection wiring 162 or the bumps 462, 463 are sufficiently pressure bonded physically and electrically to the external connection terminals 150, 250. Thus, it is not necessary to apply the same amount of load applied between the external connection terminals 150, 250 and the FPC 160 or the COG 460 in the region where the transistor circuit 170 is disposed.

Reference Example 1

Figure 8:
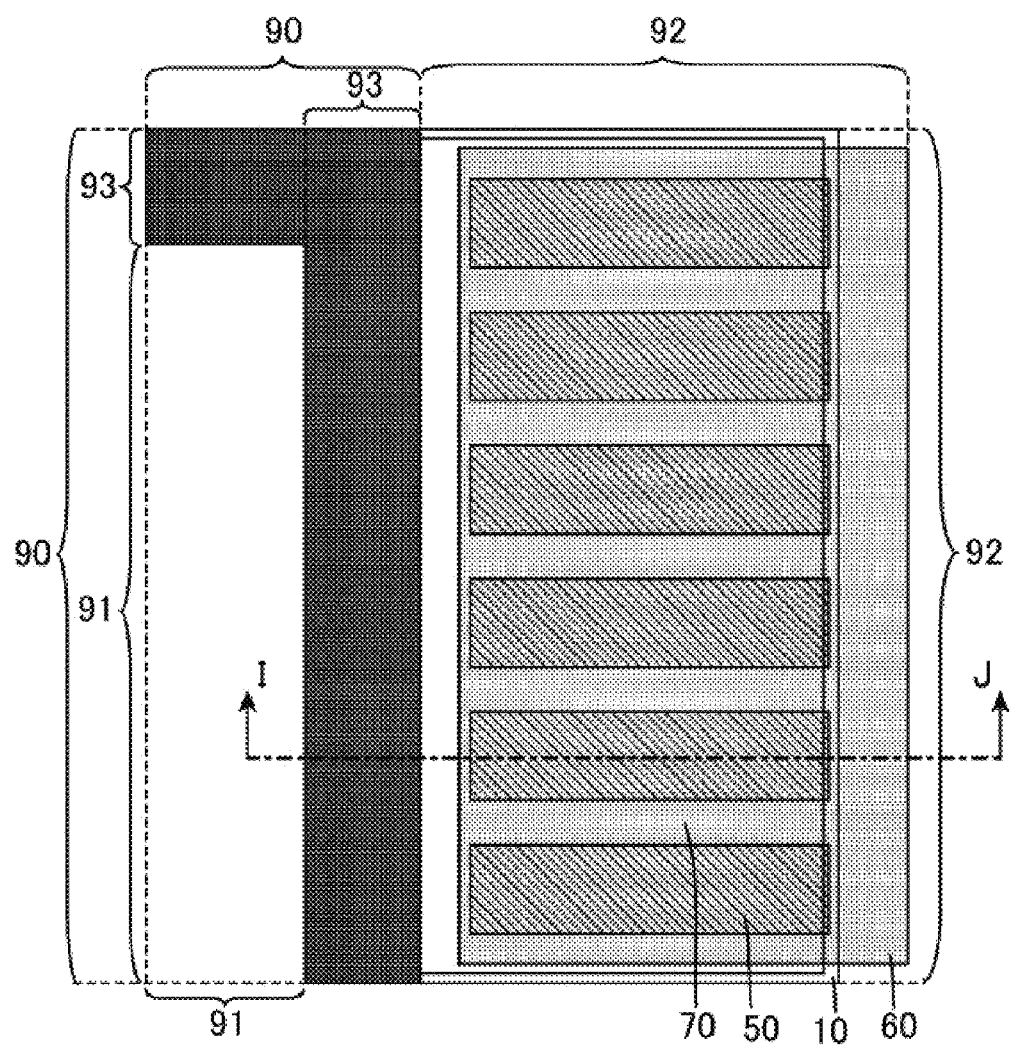
FIG. 8 is a schematic plan view of a circuit substrate according to Reference Example 1.

The circuit substrate according to Reference Example 1 is different from the circuit substrates according to Embodiments 1-3. The circuit substrate of Reference Example 1 has a structure including an external connection terminal overlapping a transistor circuit when viewed from a direction perpendicular to a main surface of the substrate. As shown in FIG. 8, the circuit substrate of Reference Example 1 is composed of a display region 90 and a peripheral circuit region 92. The display region 90 is composed of a pixel region 91 and a seal region 93 surrounding the pixel region. The circuit substrate of Example 1 has circuits formed in both the display region 90 and the peripheral circuit region 92. Thus, the circuit substrate is a full monolithic type having a single support substrate, which includes a circuit to control display elements and a peripheral circuit to control the circuit controlling the display elements. An external member 60 is provided in the peripheral circuit region 92. Thus, the circuit substrate is composed of a transistor circuit substrate 10 including the single support substrate with a plurality of circuits mounted thereon and the external member 60 connected to the transistor circuit substrate 10.

In Reference Example 1, as the external member, a flexible printed circuit (FPC) 60 is used. A plurality of circuits (transistor circuit) 70 having wiring and transistors are provided in the peripheral circuit region 92. The external connection terminal 50 is disposed through an interlayer insulating film 14 on the transistor circuit 70 and the transistor circuit 70 and the external connection terminal 50 are overlapping. FPC 60 is disposed on the external connection terminal 50, and they are connected electrically and physically through a conductive protrusion (external connection wiring) 62 provided by the FPC 60 and ACF 3.

A plurality of external connection terminals 50 connected to the FPC 60 are arranged side by side with each other in the peripheral circuit region 92 and lined up along a boundary line of the display region 90 and the peripheral circuit region 92. According to Reference Example 1, each of the external connection terminals 50 is disposed in a direction perpendicular to the boundary line between the display region 90 and the peripheral circuit region 92, specifically toward a side of the frame region (opposite side of the display region) from the pixel region 91. The transistor circuit 70 is connected to each of the external connection terminals 50, and the external connection terminal 50 is connected to the pixel region 91 constituting the display region 90 through the transistor circuit 70. The transistor circuits 70 are formed in the entire peripheral circuit region, and the external connection terminals 50 and the transistor circuits 70 are disposed to overlap with each other.

The FPC 60 connected to the external connection terminal 50 overlaps both the external connection terminal 50 and the transistor circuit 70 when viewed from a direction perpendicular to the main surface of the transistor circuit substrate 10. This means, the area (frame area) of the peripheral circuit region 92 can be reduced effectively. However, in the circuit substrate according to Reference Example 1, the external connection terminal 50 and the transistor circuit 70 are disposed to overlap with each other when viewed from a direction perpendicular to the main surface of the transistor circuit substrate 10. Therefore, during pressure bonding of the transistor circuit substrate 10 to the FPC 60, a large load is applied inside the transistor circuit 70. This may cause shorting of the fine circuit wiring and deterioration of the characteristics of transistors inside the transistor circuit 70.

A seal region 93 of the display region 90 is the region for attaching a plurality of members constituting the display region using a sealing member. This region does not actually contribute to display (however, peripheral circuit may be mounted under the sealing member). On the other hand, the pixel region 91 of the display region 90 is the region where a plurality of pixels (each of which is a single unit) constituting the display region 90 are formed, and this region actually contribute to display. The plurality of pixels are formed within the display region 90, and each pixel is driven and controlled by the transistor circuit formed inside the display element. The transistor circuit 70 formed in the peripheral circuit region 92 can be a driver block circuit further controlling the drive control of the pixel region 91.

Figure 9:
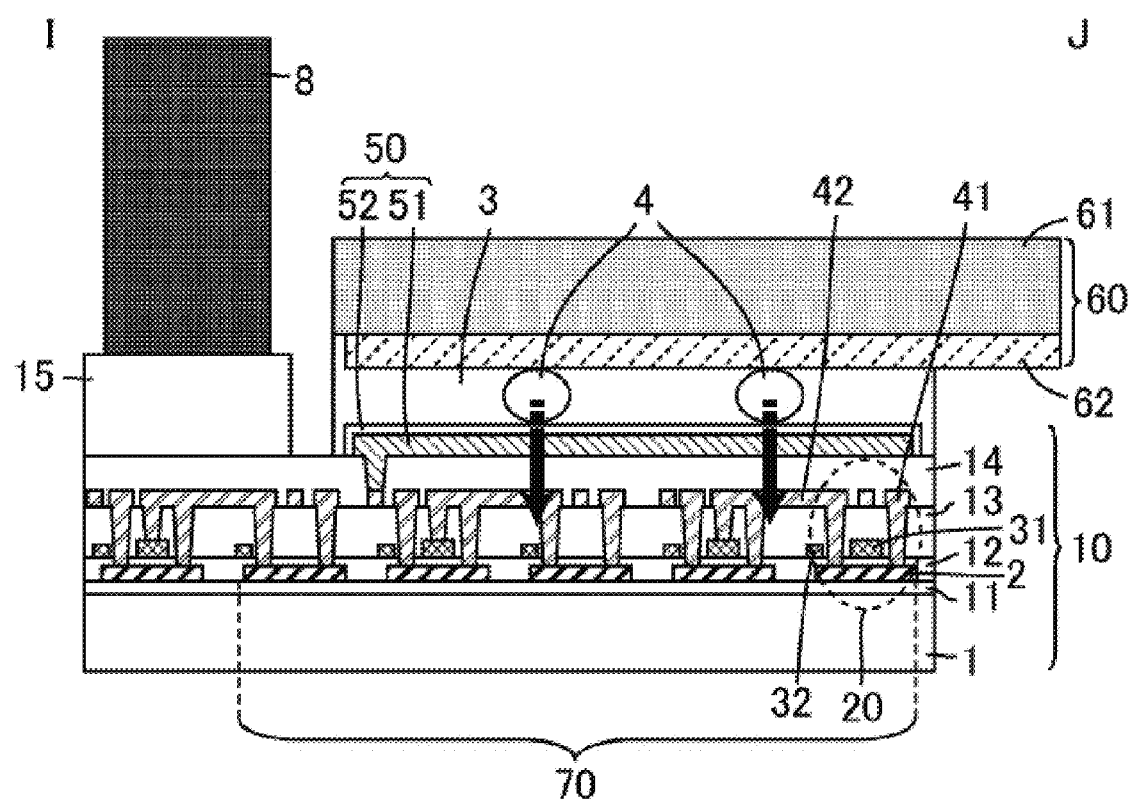
FIG. 9 is a schematic cross-sectional view along the line I-J in FIG. 8 of the circuit substrate according to Reference Example 1.

FIG. 9 is a schematic cross-sectional view along the line I-J in FIG. 8 of the circuit substrate according to Reference Example 1. As shown in FIG. 9, a base coat film (first insulating film) 11 is formed on an entire surface of the support substrate 1 in the region where the external connection terminal 50 overlaps the transistor circuit substrate 10 of Reference Example 1, and various wiring, transistors, external connection terminals and the like are disposed through the insulating film appropriately. The support substrate 1 can be, for Reference Example, glass substrate, resin substrate or the like.

The external connection terminal 50 is connected to the external member FPC 60. The FPC 60 is composed of the support substrate 61 and a bump 62 formed on the support substrate 61. The external connection terminal 50 and the FPC 60 having the external connection wiring 62 in a region overlapping the external connection terminal 50 are connected through an anisotropic conductive film (ACF) 3 and a conductive fine particle 4, which are disposed between the external connection wiring and the external connection terminal, and which electrically and physically connect the external connection wiring 62 to the external connection terminal 50. The ACF 3 is disposed so that each of the external connection terminals 50 does not electrically connect with others. The external connection wiring 62 provided with the FPC of Embodiment 1 is a wiring provided with the FPC 60. It is made of, for example, copper (Cu), gold (Au) or the like. In Reference Example 1, the width of the bump 62 is 20-300 μm when viewed from a direction perpendicular to the main surface of the substrate. The thickness of the bump 62 is 1-100 μm. For the ACF 3, a conductive fine particle 4 made from a resin ball with a diameter of 2-10 μm, plated with nickel (Ni), gold (Au) or the like, and mixed at a certain ratio with a resin composition of epoxy, acrylic or the like and a thermal cure reactant, can be used, for example. The ACF 3 can serve as an adhesive by applying a certain heat to such a resin composition. Accordingly, the ACF 3 is attached to the external connection terminal 50 provided on the transistor circuit substrate 10 and to the bump 62 provided on the FPC 60, occupying the space in-between. Accordingly, the transistor circuit substrate 10 is connected to the FPC 60 electrically and physically by thermal pressure bonding applying a certain pressure while applying a certain heat.

The transistor can be a thin film transistor (TFT) 20 that is a three terminal type field effect transistor (FET). In Reference Example 1, the transistor circuit substrate 10 has a plurality of TFTs 20, and each of the plurality of TFTs 20 has a semiconductor layer 2, and three electrodes including a gate electrode 31, a source electrode, and a drain electrode. Between the semiconductor layer 2 and the gate electrode 31, a gate insulating film (second insulating film) 12 is formed, and the semiconductor layer 2, the second insulating film 12, and the gate electrode 31 are laminated in this order from the support substrate 1. A circuit wiring 32 composed of the same material as the gate electrode 31 is formed on a side of the TFT 20 in the same layer as the gate electrode 31. On the gate electrode 31, an inorganic interlayer insulating film (third insulating film) 13 made of one layer is formed also. The source electrode and drain electrode 41 are disposed on the third insulating film 13. They are connected electrically to the semiconductor layer 2 through contact holes formed in a multi-layer insulating film made of the second insulating film 12 and the third insulating film 13. Portions of the source electrode and the drain electrode 41 are extended to form circuit wiring 42 connecting adjacent TFTs. An insulating film on the source electrode and the drain electrode 41 is an organic interlayer insulating film (fourth insulating film) 14, and on the fourth insulating film 14, an organic interlayer insulating film (fifth insulating film) 15 is formed. On the fifth insulating film 15, a sealing member 8 is disposed.

The external connection terminal 50 is made of a laminated body by laminating a plurality of conductive films. In Reference Example 1, the laminated body of the external connection terminal 50 provided on the transistor circuit substrate 10 is made by laminating a first conductive film 51 and a second conductive film 52. The first conductive film 51 is made by laminating aluminum (Al) and molybdenum (Mo) in this order from the support substrate 1. The second conductive film 52 is made of Indium Tin Oxide (ITO). The same materials as the materials (Al, Mo) used to make circuit elements of the pixel region 91, and the same material as the material used to make a pixel electrode (ITO) are used. The external connection terminal 50 is connected to the transistor circuit 70 through a contact hole formed in the interlayer insulating film 14.

As described above, the external connection terminal 50 and the FPC 60 can be unified, for example, by pressure bonding. However, during pressure bonding, a certain pressure is applied to the external connection terminal 50 in the direction of the black arrows shown in FIG. 9. In the circuit substrate according to Reference Example 1, an overlapped portion of the external connection terminal 50, ACF 3 and bump 62 serves as a pillar supporting the transistor circuit substrate 10 and the FPC 60, and the greatest pressure is applied in this region. This pillar portion has the shortest distance between the transistor circuit substrate 10 and the FPC 60. Accordingly, during pressure bonding, a large pressure is applied from the conductive fine particle 4 in the direction indicated by the black arrow as shown in FIG. 9. In Reference Example 1, the transistor circuit 10 and the external connection terminal 50 are arranged to overlap with each other. Therefore, shorting of the fine circuit wiring inside the transistor circuit 70 and deterioration of the characteristics of the transistors due to the pressure bonding may occur.

Embodiment 4

In the display devices equipped with the circuit substrates of Embodiments 1-3 are described below. The circuit substrates according to Embodiments 1-3 have the pixel region composed of a plurality of pixels. When these circuit substrates are adapted to a display device, the display device with a high resolution and good display quality can be obtained. The display device of Embodiment 4 can be a liquid crystal display device, electro-luminance (EL) display device, plasma display device, Braun tube (CRT) display device and the like. A pixel is a display unit constituting the pixel region and depending on types of display devices, definition may differ. For example, in case of a liquid crystal display device, a pixel electrode and a color filter disposed for the pixel electrode constitute one single pixel.

A display element needs to be disposed in a position overlapping the pixel region in order to apply the circuit substrates of Embodiments 1-3 to a display device. The sealing member provided on the circuit substrates of Embodiments 1-3 is disposed to seal the display element, for example, and is composed of epoxy resin of such types as thermal cure or light cure, acrylic, or the like. The display element can be a liquid crystal layer, organic EL layer, inorganic EL layer, fluorescence material or the like. If the display device of Embodiment 4 does not have a light emitting display element, a light source needs to be disposed separately in order to display.

Embodiment 5

A manufacturing method for the circuit substrates of Embodiments 1-3 is described below. Also, a manufacturing method for the liquid display device of Embodiment 4, which adopts these circuit substrates, is described. Common points of the respective manufacturing methods are described below unless otherwise noted. Specific points for each the manufacturing method are explained as necessary.

First, cleaning and pre-annealing steps of the support substrate 1 are conducted as a pre-processing. Types of the support substrates are not specifically limited. From the viewpoint of costs, however, a glass substrate or resin substrate is suitable. Next, the following manufacturing steps (1)-(15) are conducted.

(1) Base coat film (first insulating film) 11 formation steps

An SiON film with 50 nm thickness and an SiOx film with a 100 nm thickness are formed in this order by the Plasma Enhanced Chemical Vapor Deposition (hereinafter PECVD) method to form a base coat film on the support substrate 1. A mixed gas of monosilane ($SiH_4$), nitrogen oxide gas ($N_2O$), and ammonium ($NH_3$) can be used as the material gas for forming the SiON film. A material gas such as tetra ethyl ortho silicate (TEOS) gas can preferably be used to form the SiOx film. The base-coat film may contain silicon nitride film (SiNx) formed using a gas mixture of monosilane ($SiH_4$) and ammonium ($NH_3$) as the material gases.

(2) Semiconductor layer 2 formation steps

An amorphous silicon (a-Si) film with a 50 nm thickness is formed by the PECVD method. For the material gas to form the a-Si film, $SiH_4$, disilane ($Si_2H_6$) or the like can be used, for example. Because the a-Si film formed by the PECVD method contains hydrogen, a process to reduce hydrogen concentration in the a-Si film (dehydrogenation process) is performed at 500° C. Next, a poly-silicon (p-Si) film is formed using laser annealing, which melts the a-Si film. Then it is cooled and crystallized to form p-Si film. For the laser annealing, an excimer laser can be used, for example. In forming the p-Si film, as a pre-processing to laser annealing and in order to form continuous grain crystalline silicon (CG-silicon), a metallic catalyst such as nickel may be applied to perform a solid phase growth based on a thermal treatment instead of dehydrogenation. Also, for crystallizing a-Si film, a solid phase growth based on a thermal treatment alone can be used. Next, the p-Si film is patterned by dry etching using a gas mixture of tetrafluoromethane ($CF_4$) and oxygen ($O_2$) to form a semiconductor layer.

(3) Gate insulating film (second insulating film) 12 formation steps

Next, a gate insulating film with a 45 nm film thickness of silicon oxide is formed using a TEOS gas as the material gas. The material for the gate insulating film is not specifically limited. An SiNx film, SiON film or the like can be used. For material gases to form SiNx film and SiON film, material gases similar to the ones described in the formation of the base coat film can be used. Also, the gate insulating film can be a laminated body using a plurality of materials described above.

(4) Ion doping steps

Impurities such as boron are doped to the semiconductor layer in order to control the threshold voltage of TFTs using ion doping method, ion implantation method or the like. More specifically, impurities such as boron are doped to the semiconductor layer, which will become an N channel type TFT and a P channel type TFT (first doping step). Then, impurities such as boron are further doped to the semiconductor layer that will become the N channel type while the semiconductor layer that will become the P channel type is masked by a resist (second doping step). If the threshold voltage control of the P channel type TFT is not necessary, then the first doping step can be skipped.

(5) Formation steps for conductive films 151, 151a, 151b, 251, 251a, 251b composing gate electrode 31, circuit wiring 32, and external connection terminals 50, 150, 250, and terminal lead-out wirings 81, 82, 83 (hereinafter referred to as "gate electrode and the like")

Next, a nitride tantalum (TaN) film with a 50 nm thickness and a tungsten (W) film with a 350 nm thickness are formed in this order using a sputtering method. Then, a resist mask is formed by patterning the resist film to a desired pattern by a photolithography method. The gate electrodes and the like are formed next by dry etching using an etching gas with adjusted amount of mixed gases including argon (Ar), sulfur hexafluoride ($SF_6$), tetrafluoromethane ($CF_4$), oxygen ($O_2$), chlorine ($Cl_2$) and the like. As the material for the gate electrode and the like, high melting point metals having a flat surface with stable properties, such as tantalum (Ta), molybdenum (Mo), and molybdenum tungsten (MoW), aluminum (Al) and like metals with a low electrical resistivity can be used. The gate electrode and the like described above can be a laminated body having the plurality of materials described above. During patterning, circuit wirings composed of the materials described above may be formed adjacent to the TFT.

(6) Source region and drain region formation steps

Next, impurities such as phosphorus for the N channel TFT and impurities such as boron for the P channel type TFT are doped at high concentration to the semiconductor layer by ion doping method, ion implantation method, or the like in order to form source regions and drain regions of the TFTs using the gate electrodes as a mask. LDD (lightly doped drain) regions may be formed as necessary. Next, about 6 hours of thermal activation processing at about 700° C. is performed in order to activate impurity ions in the semiconductor layer. The electrical conductivity of the source region and the drain region can be improved by this. An excimer laser irradiation method can also be used for the activation.

(7) Inorganic interlayer insulating film (third insulating film) 13 formation steps Next, an SiNx film with a 700 nm thickness and a TEOS film with a 250 nm thickness are formed by the PECVD method to form an inorganic interlayer insulating film on an entire surface of the insulating substrate. An SiON film or the like can also be used as the inorganic interlayer insulating film. In order to minimize deterioration of the TFT characteristics due to transient deterioration and to stabilize the electrical characteristics of the TFT, a thin cap film (a TEOS film or the like, for example) of about 50 nm in thickness may be formed underneath the inorganic interlayer insulating film.

(8) Contact hole formation steps

Next, a resist mask is formed by patterning a resist film to a desired pattern by photolithography method. Wet etching of the gate insulting film and the inorganic interlayer insulating film is performed using an etching solution of hydrofluoric acid type to form contact holes. Then, a thermal treatment is performed at about 400° C. for one hour. Dry etching may also be performed for the etching.

(9) Formation steps for source electrode and drain electrode 41, circuit wiring 42, lead-out wiring 5, terminal lead-out wiring 80 (Embodiment 1) and conductive films 152, 152a, 152b, 252, 252a, 252b (Embodiments 2, 3) constituting the external connection terminals 150, 250 (hereinafter referred to as "source electrode, drain electrode and the like")

Next, a titanium (Ti) film with a 100 nm film thickness, an aluminum (Al) with a 500 nm film thickness, and a Ti film with a 100 nm film thickness are formed in this order by sputtering or the like. Then, a resist mask is formed by patterning a resist film to a desired shape by photolithography. Patterning of the laminated metallic film of Ti/Al/Ti is performed by dry etching to form source electrodes, drain electrodes and the like. An Al—Si alloy or the like can be used as the metals for forming the source electrodes, drain electrodes and the like instead of Al. Here, Al is used in order to lower the wiring resistance. If high heat resistance is needed and some level of electrical resistance increase is tolerated (as in the case of using short wiring structure, for example) gate electrode materials (Ta, Mo, MoW, W, TaN, and the like) as described above can be used as a constituent metal for forming the source electrodes, drain electrodes and the like.

(10) Organic interlayer insulating film (fourth insulating film) 14 formation steps Next, a photosensitive resin, such as a photosensitive acrylic resin film, or the like is formed (applied) to a thickness of 2.5 μm using a spin coat method to form an organic interlayer insulating film. A non-photosensitive resin, such as non-photosensitive acrylic resin film, photosensitive or non-photosensitive polydimethylsiloxane type resins, polysilazane type resins, and polyimide parellin type resins can also be used as the material for organic interlayer insulating film. Methyl containing polysiloxane (MSQ) type materials and porous MSQ type materials can also be used as the material for the organic interlayer insulating film. If photosensitive materials are used, etching is done by photo developing process.

(11) Formation steps for TFT upper wiring 45 (Embodiment 2), conductive films 153, 153a, 153b, 253, 253a, 253b (Embodiments 2, 3) constituting the external connection terminals 150, 250, and first conductive film 51 (Embodiment 1) constituting the external connection terminal 50 (hereinafter referred to as TFT upper wiring)

Next, an aluminum (Al) film with a 400 nm film thickness and a molybdenum (Mo) film with a 100 nm film thickness are formed in this order by sputtering or the like. Instead of molybdenum, IZO can also be used. Then, a resist mask is formed by patterning a resist film to a desired shape by photolithography. Patterning by dry etching is performed to form the TFT upper wiring.

An Al—Si alloy or the like can be used as the metal for forming the TFT upper wiring instead of Al. Here, Al is used in order to lower the wiring resistance. If high heat resistance is needed and some level of electrical resistance increase is tolerated (as in the case of using short wiring structure, for example), the gate electrode materials (Ta, Mo, MoW, W, TaN and the like) as described above can be used as constituent metals for forming the TFT upper wiring.

(12) Conductive films 154, 154a, 154b, 254, 254a, 254b (Embodiments 2, 3) constituting a pixel electrode, external connection terminal 150, 250 and the second conductive film 52 (Embodiment 1) constituting the external connection terminal 50

Next, a metallic oxide film (ITO) having transparency such as indium oxide tin with a 100 nm film thickness is formed by sputtering method. Then, a resist mask is formed by patterning a resist film to a desired shape based on photolithographic method. Patterning of the ITO film by dry etching is performed to form pixel electrodes. IZO or the like can also be used as a metallic oxide constituting the pixel electrodes.

(13) Organic interlayer insulating layer (fifth insulating layer) 15 formation steps Next, a photosensitive acrylic resin film with a 2.5 μm film thickness is applied using spin coat method to form an organic interlayer insulating film. A non-photosensitive resin such as non-photosensitive acrylic resin film, photosensitive or non-photosensitive polydimethylsiloxane type resin, polysilazane type resin, polyimide parellin type resin or the like can also be used as the organic interlayer insulating film. Methyl containing polysiloxane (MSQ) type materials and porous MSQ type materials can also be used as the material for the organic interlayer insulating film.

(14) Panel assembly steps (liquid crystal panel manufacturing method)

Next, a liquid crystal display panel is assembled by performing the step of attaching the transistor circuit substrate 10 (array substrate) to a color filter substrate using a sealing member 8, the step of injecting liquid crystal, the step of cutting (panel) and the step of polarizing plates. The liquid crystal mode for the liquid crystal display panel is not specifically limited. The mode can be the TN (twisted nematic) mode, the IPS (in plane switching) mode, the VA (vertical alignment) mode or the like, for example. The liquid crystal display panel may be of orientation division type. Further, the liquid crystal display panel may be a transmissive type, reflective type, or semi-transmissive type (display device type that performs both the reflective and transmissive displays). The driving method for the liquid crystal display panel may be an active matrix type or passive matrix type.

(15) External member (FPC, COG and electronic components) 60, 160, 260 360, 460 attachment steps Next, the panel and the external member are thermal pressure bonded through ACF (anisotropic conductive film) 3 having conductive fine particles 4 distributed in a resin adhesive (thermal cure resin of thermal cure epoxy type resin or the like, for example). By these steps, the TFT substrate and the external member are connected and fixed to each other.

Further, the liquid crystal display panel is combined with a mounting substrate and a backlight unit to complete a liquid crystal display device.

According to the present embodiments of the liquid crystal display device, improved reliability and a reduced frame area become possible.

The present application claims priority to Patent Application No. 2008-248424 filed in Japan on Sep. 26, 2008 under the Paris Convention and provisions of national law in a designated State, the entire contents of which are hereby incorporated by reference.

DESCRIPTION OF REFERENCE CHARACTERS 1 support substrate
2 semiconductor layer 3 anisotropic conductive film
4 conductive fine particles (conductive member)
5 lead-out wiring
8 sealing material
10 transistor circuit substrate
11 base coat film (first insulating film)
12 gate insulating film (second insulating film)
13 inorganic interlayer insulating film (third insulating film)
14 organic interlayer insulating film (fourth insulating film)
15 organic interlayer insulating film (fifth insulating film)
20 TFT
31 gate electrode
32 circuit wiring
41 source electrode and drain electrode
42 circuit wiring
45 TFT upper wiring
50 external connection terminal
51 first conductive film
52 second conductive film
60, 160 flexible printed circuit board (FPC) (external member)
61, 161, 261, 461 support substrate
62, 262, 462, 463 bump (conductive protrusion)
70 transistor circuit
80 terminal lead-out wiring
81 first terminal lead-out wiring
82 second terminal lead-out wiring
83 third terminal lead-out wiring
90 display region
91 pixel region
92 peripheral circuit region
93 seal region
150 first external connection terminal
151, 151a, 151b, 251, 251a, 251b conductive film including a material composing a gate electrode
152, 152a, 152b, 252, 252a, 252b conductive film including a material composing a source electrode and a drain electrode
153, 153a, 153b, 253, 253a, 253b conductive film including a material composing a TFT upper wiring
154, 154a, 154b, 254, 254a, 254b conductive film including a material composing a pixel electrode
162 external connection wiring (conductive protrusion)
170 first transistor circuit
250 second external connection terminal
250a second external connection terminal (input side)
250b second external connection terminal (output side)
260, 460, COG (external member)
263 dummy bump
270 second transistor circuit
350 third external connection terminal
350a third external connection terminal (input side)
350b third external connection terminal (output side)
360, 560, electronic component (external member)
370 third transistor circuit

The invention claimed is:

1. A circuit substrate comprising:
a transistor substrate having a support substrate with a transistor and an external connection terminal mounted thereon; and
an external member attached to the transistor substrate,
wherein the external member is connected physically and electrically through a conductive member to the external connection terminal, and the transistor is disposed side by side with the external connection terminal,
wherein the transistor is disposed in a region overlapping the external member, and
wherein the conductive member is a conductive fine particle in an anisotropic conductive film and a distance between the transistor substrate and the external member in a region overlapping the transistor is larger than the diameter of the conductive fine particle.

2. The circuit substrate according to claim 1, wherein the external member has a conductive protrusion in an area that overlaps the external connection terminal.

3. The circuit substrate according to claim 1, wherein a distance between the transistor substrate and the external member is shorter in a region overlapping the external connection terminal than in a region overlapping the transistor.

4. The circuit substrate according to claim 1, wherein a distance between the transistor substrate and the external member is shortest in a region overlapping the external connection terminal.

5. The circuit substrate according to claim 1, wherein the external connection terminal is a laminated body with a plurality of conductive films laminated thereon.

6. The circuit substrate according to claim 1, wherein the circuit substrate further comprises an inorganic insulating film located directly underneath a surface on an opposite side of a surface of the external connection terminal where the external member is connected.

7. The circuit substrate according to claim 1, wherein the circuit substrate further comprises a sub-pillar assisting physical connection of the transistor substrate and the external member.

8. The circuit substrate according to claim 1, wherein a plurality of the external connection terminals are disposed side by side forming a sequence of lines linearly or in a zigzag manner.

9. The circuit substrate according to claim 1, wherein the circuit substrate further comprises an input external connection terminal and an output external connection terminal, and the input external connection terminal and the output external connection terminal are disposed alternately to form a line.

10. The circuit substrate according to claim 1, wherein the circuit substrate is a display device circuit substrate including a display region and a peripheral circuit region, and the external member is disposed in the peripheral circuit region.

11. A display device comprising the circuit substrate according to claim 1, wherein the circuit substrate includes a display region and a peripheral circuit region, and the external member is disposed in the peripheral circuit region.

12. The circuit substrate according to claim 2, wherein the conductive member and the conductive protrusion serve as a pillar supporting the transistor substrate and the external member.

13. The circuit substrate according to claim 5, wherein the laminated body comprises a conductive film having a material constituting the transistor.

14. The circuit substrate according to claim 8, wherein the sequence of lines is disposed along a side of the external member.

15. The circuit substrate according to claim 10, wherein the circuit substrate further comprises a lead-out wiring having at least one bending portion, and the lead-out wiring extends from the external connection terminal in a direction away from the display region and through the bending portion extends toward the display region.

16. A circuit substrate comprising:
a circuit wiring substrate having a support substrate with a circuit wiring and an external connection terminal mounted thereon; and an external member attached to the circuit wiring substrate,
wherein the external member is connected physically and electrically through a conductive member to the external connection terminal, and the circuit wiring includes a fine circuit wiring having a width narrower than a width of the conductive member,
wherein the fine circuit wiring is disposed side by side with the external connection terminal,
wherein the fine circuit wiring is disposed in a region overlapping the external member, and
wherein the conductive member is a conductive fine particle in an anisotropic conductive film and a distance between the circuit wiring substrate and the external member in a region overlapping the fine circuit wiring is larger than the diameter of the conductive fine particle.

17. The circuit substrate according to claim 16, wherein the external member has a conductive protrusion in an area that overlaps the external connection terminal, and
wherein the conductive member and the conductive protrusion serve as a pillar supporting the circuit wiring substrate and the external member.

18. The circuit substrate according to claim 16, wherein a distance between the circuit wiring substrate and the external member is shorter in a region overlapping the external connection terminal than in a region overlapping the fine circuit wiring.

19. The circuit substrate according to claim 16, wherein a distance between the circuit wiring substrate and the external member is shortest in a region overlapping the external connection terminal.

20. The circuit substrate according to claim 16, wherein the external connection terminal is a laminated body with a plurality of conductive films laminated thereon, and
wherein the laminated body comprises a conductive film having a material constituting the circuit wiring.

21. The circuit substrate according to claim 16, wherein the circuit wiring comprises a lead-out wiring including at least one bending portion.

22. The circuit substrate according to claim 16, wherein the circuit substrate further comprises a sub-pillar assisting physical connection of the circuit wiring substrate and the external member.

23. A display device comprising the circuit substrate according to claim 16, wherein the circuit substrate includes a display region and a peripheral circuit region, and the external member is disposed in the peripheral circuit region.

24. The circuit substrate according to claim 21, wherein the lead-out wiring comprises a fine circuit wiring.

25. The circuit substrate according to claim 21, wherein the lead-out wiring is further extended from a terminal lead-out wiring which extends from the external connection terminal.

26. A circuit substrate comprising:
a transistor substrate having a support substrate with a transistor and an external connection terminal mounted thereon; and
an external member attached to the transistor substrate,
wherein the external member is connected physically and electrically through a conductive member to the external connection terminal, and the transistor is disposed side by side with the external connection terminal,
wherein the transistor is disposed in a region overlapping the external member, and
wherein the conductive member is a conductive fine particle in an anisotropic conductive film and a distance between the transistor substrate and the external member in a region overlapping the external connection terminal is smaller than the diameter of the conductive fine particle.

27. A display device comprising the circuit substrate according to claim 26, wherein the circuit substrate includes a display region and a peripheral circuit region, and the external member is disposed in the peripheral circuit region.

28. A circuit substrate comprising:
a circuit wiring substrate having a support substrate with a circuit wiring and an external connection terminal mounted thereon; and
an external member attached to the circuit wiring substrate,
wherein the external member is connected physically and electrically through a conductive member to the external connection terminal, and the circuit wiring includes a fine circuit wiring having a width narrower than a width of the conductive member,
wherein the fine circuit wiring is disposed side by side with the external connection terminal,
wherein the fine circuit wiring is disposed in a region overlapping the external member, and
wherein the conductive member is a conductive fine particle in an anisotropic conductive film and a distance between the circuit wiring substrate and the external member in a region overlapping the external connection terminal is smaller than the diameter of the conductive fine particle.

29. A display device comprising the circuit substrate according to claim 28, wherein the circuit substrate includes a display region and a peripheral circuit region, and the external member is disposed in the peripheral circuit region.

\* \* \* \* \*